（12）United States Patent
Kim et al.

(10) Patent No.: US 11,107,792 B2
(45) Date of Patent: Aug. 31, 2021

(54) STRETCHABLE DISPLAY DEVICE

(71) Applicant: LG Display Co., Ltd., Seoul (KR)

(72) Inventors: Kihan Kim, Paju-si (KR); Hyokang Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 108 days.

(21) Appl. No.: 16/688,900

(22) Filed: Nov. 19, 2019

(65) Prior Publication Data

US 2020/0161276 A1 May 21, 2020

(30) Foreign Application Priority Data

Nov. 20, 2018 (KR) .......................... 10-2018-0143758
Sep. 24, 2019 (KR) .......................... 10-2019-0117516

(51) Int. Cl.
| | | |
|---|---|---|
| *H05K 1/00* | (2006.01) | |
| *H01L 25/065* | (2006.01) | |
| *G09F 9/30* | (2006.01) | |
| *G06F 1/16* | (2006.01) | |

(52) U.S. Cl.
CPC ........ *H01L 25/0655* (2013.01); *G06F 1/1652* (2013.01); *G09F 9/301* (2013.01)

(58) Field of Classification Search
USPC ....................................................... 361/749
See application file for complete search history.

(56) References Cited

U.S. PATENT DOCUMENTS

| | | | |
|---|---|---|---|
| 9,226,432 B2 | 12/2015 | Yamakita | |
| 9,423,915 B2 * | 8/2016 | Kang | ..................... G06F 1/1652 |
| 2015/0070309 A1 * | 3/2015 | Kang | ..................... G06F 3/0445 |
| | | | 345/174 |

FOREIGN PATENT DOCUMENTS

| | | |
|---|---|---|
| KR | 10-2014-0099139 A | 8/2014 |
| KR | 10-1810050 B1 | 12/2017 |

* cited by examiner

*Primary Examiner* — Andargie M Aychillhum
(74) *Attorney, Agent, or Firm* — Seed IP Law Group LLP

(57) ABSTRACT

The present disclosure discloses a stretchable display device, including a lower substrate as a first substrate, the lower substrate having an active area and a non-active area surrounding the active area; a plurality of second substrates positioned on the lower substrate and horizontally separated from each other; a transistor disposed on the second substrate; a plurality of light emitting elements disposed above the transistor and above the plurality of second substrates; a plurality of connecting substrate positioned between the plurality of second substrates to interconnect two adjacent second substrates. With this structure of the display, especially to the structure of the connecting substrate and the connection line, the stress applied to the stretchable display the connecting lines may be attenuated.

34 Claims, 22 Drawing Sheets

STRETCHABLE DISPLAY DEVICE

CROSS-REFERENCE TO RELATED APPLICATIONS

This application claims the priority of Korean Patent Application No. KR 10-2018-0143758 filed on Nov. 20, 2018, and Korean Patent Application No. KR 10-2019-0117516 filed on Sep. 24, 2019 in the Korean Intellectual Property Office, the disclosures of which are incorporated herein by reference.

BACKGROUND

Technical Field

The present disclosure relates to a stretchable display device.

Description of the Related Art

An Organic Light Emitting Display (OLED) that emits light by itself, a Liquid Crystal Display (LCD) that requires separate light sources, etc., are used as the display devices used in a computer monitor, a TV, and a mobile phone.

Display devices are being applied to more and more various fields including not only a computer monitor and a TV, but personal mobile devices, and a display device having a wide active area and reduced volume and weight is being studied.

BRIEF SUMMARY

Recently, a stretchable display device manufactured to be able to stretch or contract in a specific direction and change into various shapes by forming a display unit, lines, etc., on a flexible substrate such as plastic that is a flexible material has been spotlighted as a next generation display device.

Accordingly, the present disclosure provides a stretchable display device capable of improving the mechanical stability and reliability when undergoing the operation of expanding or contracting.

In addition, the present disclosure provides a novel display device that is capable of stretching while at the same time effectively displaying a desired image.

Further, the present disclosure provides a stretchable display device that may attenuate or alleviate the stress that is being applied to the lines of the device during a stretching operation.

The present disclosure is not limited to the above-mentioned advantages. Other advantages of the present disclosure, as not mentioned above, may be understood from the following descriptions and more clearly understood from the embodiments of the present disclosure. Further, it will be readily appreciated that the objects and advantages of the present disclosure may be realized by features and combinations thereof as disclosed in the claims.

According to an aspect of the present disclosure, there is provided a stretchable display device comprising: a lower substrate as a first substrate, the lower substrate having an active area and a non-active area surrounding the active area; a plurality of second substrates positioned on the lower substrate and horizontally separated from each other; a transistor disposed on the second substrate; a plurality of light emitting elements disposed above the transistor and above the plurality of second substrates; a plurality of third substrates positioned between the plurality of second substrates to interconnect two adjacent second substrates, and the third substrate comprising a portion having a narrower width than other portion of the third substrate.

According to another aspect of the present disclosure, there is provided a display device, comprising a first substrate having an active area and a non-active area surrounding the active area; a plurality of second substrates positioned on the first substrate and separated from each other in horizontal direction; a plurality of light emitting elements disposed above the second substrates; a plurality of connecting substrates positioned between the plurality of second substrates to interconnect two adjacent second substrates, the connecting substrate comprising a portion having a narrower width than other portion of the connecting substrate; an upper substrate covering the first substrate and the plurality of light emitting elements; and wherein at least one of the first substrate and the upper substrate is configured to have a tensile fracture rate equal to or larger than 100%.

The stretchable display device may further comprise a plurality of connection lines disposed on the third substrate, and configured to connect to pads of the two adjacent second substrates.

The third substrates as connecting substrates have curved shape.

The third substrate have a top surface and a bottom surface, and a horizontal cross sectional area of the third substrate varies between the top surface and the bottom surface.

The horizontal cross sectional area of the third substrate decrease away from the top surface.

The third substrate further has a middle portion including a predetermined surface positioned between the top surface and the bottom surface of the third substrates, and the predetermined surface of the middle portion has the smallest width of surfaces positioned between the top surface and the bottom surface.

The third substrate has an hourglass-shaped cross-section.

The middle portion of the third substrate is positioned closer to the top surface of the connecting substrate, or is positioned closer to the bottom surface of the connecting substrate.

The sides of the third substrate have an angular shape.

The plurality of connection lines include first connecting lines and second connecting lines, the first connecting lines extending in a first direction, and the second connecting lines extending in a second direction different from the first direction.

The first connecting lines serve as gate lines, and the first connecting lines may electrically connect the gate pads formed on each of the adjacent second substrates.

The second connecting lines serve as data lines, and the second connecting lines electrically connect the source electrode of the transistors formed on each of the adjacent second substrates.

At least some of the plurality of connection lines may include a first connection layer, a second connection layer, and a plurality of flexible particles between the first connection layer and the second connection layer.

An elastic modulus of the plurality of flexible particles may be 1 MPa or less.

At least some of the plurality of connection lines may be made of a metal material, and have a net structure.

The plurality of connection lines may include a plurality of air gaps.

The upper substrate may fill the plurality of air gaps of the plurality of the connecting lines.

The upper substrate may fill the gaps between the third substrates and the second substrate.

The upper substrate may be disposed in contact with sides of the plurality of third substrates.

A top surface of the connecting substrates may have a larger width than the connecting line.

The stretchable display device may further comprise a plurality of conductive components disposed on each of the plurality of second substrates, wherein the plurality of third substrates and the plurality of connecting lines may have a curved shape, and the plurality of connecting lines may be made of the same material as at least one of the plurality of conductive components.

The plurality of light emitting elements may include an organic light emitting element comprising an anode, an organic light emitting layer on the anode, and a cathode covering the organic light emitting layer; and wherein the organic light emitting element may further comprise encapsulation layer over the organic light emitting layer.

The plurality of light emitting elements may include an inorganic light emitting element, the inorganic light emitting element include a n-type layer, an active layer, a p-type layer, an n-electrode, and a p-electrode, without disposing any encapsulation layer over the inorganic light emitting element.

The plurality of the second substrates may be more rigid than the first substrate.

The modulus of the second substrates may be one thousand times or more of that of the first substrate.

The upper substrate may be made of a material having a smaller modulus than the plurality of connecting substrates.

The upper substrate may be made of the same material as the first substrate.

The stretchable display device may further comprise a plurality of connection lines disposed on the connecting substrates, and may be configured to connect to pads of the two adjacent second substrates.

The upper substrate may fill gaps between the connecting substrates and the second substrate.

The shape of the connection lines may follow the shape of the connecting substrates in a plan view.

The display device according to the present disclosure having the features as described below has following effects. However, the present disclosure is not limited thereto.

According to the present disclosure, the stress for expending or contracting the display device will be relieved by the structure of the display together with the design of the connection portions of the display device.

Further specific effects of the present disclosure as well as the effects as described above will be described in conduction with illustrations of specific details for carrying out the present disclosure.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
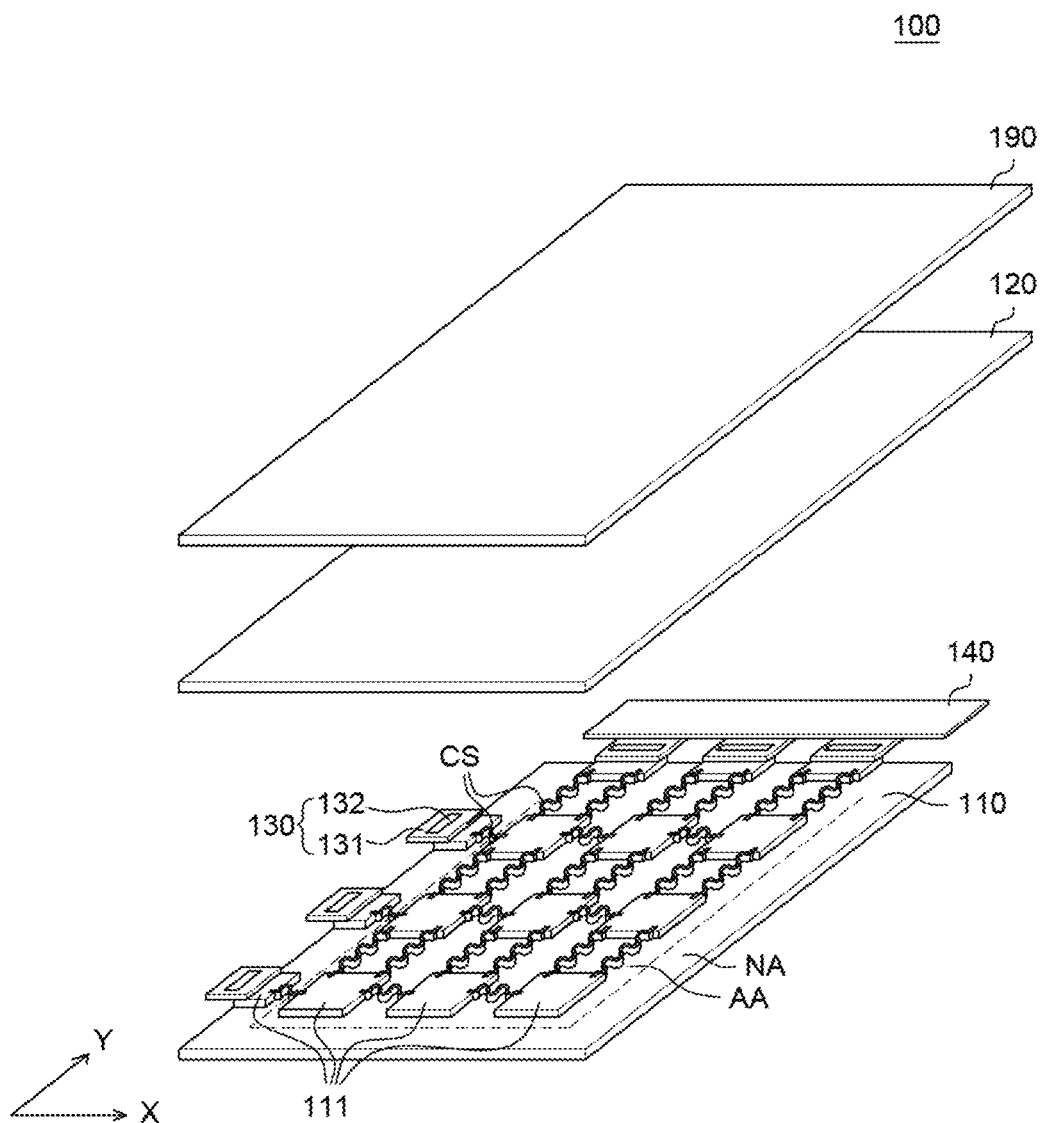
FIG. 1 is an exploded perspective view of a stretchable display device according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including" and "having" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a stretchable display device according to various embodiments of the present disclosure will be described in detail with reference to accompanying drawings.

A stretchable display device may be referred to as a display device that can display images even if it bends or stretches. A stretchable display device can have high flexibility, pliability, as compared with general display devices of the related art. Accordingly, the shape of the stretchable display device can be freely changed in accordance with operation by a user such as bending or stretching the stretchable display device. For example, when a user holds and pulls an end of a stretchable display device, the stretchable display device can be stretched by the force applied by the user. Alternatively, when a user puts a stretchable display device on an uneven wall, the stretchable display device can be disposed to be bent along the surface of the wall according to the shape of the wall. When the force applied by the user is removed, the stretchable display device can return into its initial shape.

FIG. 1 is an exploded perspective view of a stretchable display device 100 according to an embodiment of the present disclosure. Referring to FIG. 1, a stretchable display device 100 includes a lower substrate 110, a plurality of second substrates 111, a plurality of connecting substrates CS, Chip on Films (COF) 130, a printed circuit board 140, an upper substrate 120, and a polarizing layer 190.

The lower substrate 110, which is a substrate for supporting and protecting various components of the stretchable display device 100, may be referred to as a first substrate. The lower substrate 110, which is a flexible substrate, may be made of a bendable or stretchable insulating material. For example, the lower substrate 110 may be made of silicon rubber such as polydiimethylsiloxane (PDMS) or an elastomer such as polyurethane (PU) and polytetrafluoroethylene (PTFE), so it can have flexibility. The material of the lower substrate 110, however, is not limited thereto.

The lower substrate 110, which is a flexible substrate, may reversibly expand and contract. The lower substrate 110 may have an elastic modulus of several to hundreds of MPa and a tensile fracture rate of about 100% or more. However, elastic modulus and tensile fracture rate having other ranges may be employed. The thickness of the lower substrate 110 may be about 10 µm to 1 mm, but is not limited thereto.

The lower substrate 110 may have an active area AA and a non-active area NA adjacent to the active area AA.

The active area AA is an area where images are displayed on the stretchable display device 100, and light emitting elements and various driving elements for driving the light emitting elements are disposed in the active area AA. The active area AA includes a plurality of pixels including a plurality of subpixels. The plurality of pixels is disposed in the active area AA and include a plurality of light emitting elements. The plurality of subpixels each may be connected with various circuit lines. For example, the plurality of subpixels each may be connected with various lines such as a gate line, a data line, a high-potential power line, a low-potential power line, and a reference voltage line or the like.

The non-active area NA is an area adjacent to the active area AA. In some embodiments, the non-active area NA is an area disposed adjacent to the active area AA and surrounding the active area AA. The non-active area NA is an area where an image is not displayed, and lines and circuits may be disposed in the non-active area NA. For example, a plurality of pads may be disposed in the non-active area NA and the pads may be respectively connected with the plurality of subpixels in the active area AA.

The plurality of second substrates 111 is disposed on the lower substrate 110. The plurality of second substrates 111, which is relatively rigid substrates, is spaced apart from each other and independently disposed on the lower substrate 110. The plurality of second substrates 111 may be relatively more rigid than the lower substrate 110. That is, the lower substrate 110 may be softer than the plurality of second substrates 111 and the plurality of second substrates 111 may be more rigid than the lower substrate 110.

The plurality of second substrates 111, which is the plurality of relatively rigid substrates, may be made of plastic having less flexibility and, for example, may be made of polyimide (PI), polyacrylate, or polyacetate or other suitable materials having like characteristics.

The modulus of the plurality of second substrates 111 may be higher than that of the lower substrate 110. The modulus is an elastic modulus showing the ratio of deformation of a substrate to stress applied to the substrate, and when the modulus is relatively high, the strength may be relatively high. Accordingly, the plurality of second substrates 111 may be the plurality of rigid substrates that are more rigid than the lower substrate 110. The modulus of the plurality of second substrates 111 may be several thousand times larger than that of the lower substrate 110 (e.g., one thousand times), but is not limited thereto.

In some embodiments, the lower substrate 110 may include a plurality of first lower patterns and second lower patterns. The plurality of first lower patterns may be disposed in areas overlapped with the plurality of second substrates 111 of the lower substrate 110 and the second lower patterns may be disposed in an area excepting the areas disposing the plurality of second substrates 111 or may be disposed in the entire area of the stretchable display device 100.

The plurality of first lower patterns may be larger in modulus than the second lower patterns. For example, the plurality of first lower patterns may be made of substantially the same material as the second substrates 111, while the second lower patterns may be made of a substance having a smaller modulus than the plurality of second substrates 111.

Referring to FIG. 1, a plurality of connecting substrates CS is disposed between the plurality of second substrates 111. The plurality of connecting substrates CS, which is substrates connecting adjacent second substrates 111, may be referred to as third substrates. The plurality of connecting substrates CS may be simultaneously and integrally made of the same material as the second substrates 111, but are not limited thereto.

Referring to FIG. 1, the plurality of connecting substrates CS has a curved shape or a wavy or undulating shape. For example, as shown in FIG. 1, the plurality of connecting substrates CS may have a sine waveform. However, the plurality of connecting substrates CS is not limited to this shape and may have various shapes. For example, the plurality of connecting substrates CS may extend in a zigzag shape or a plurality of diamond-shaped connecting substrates may extend with the apexes connected. The number and shape of the plurality of connecting substrates CS shown in FIG. 1 are examples and may be changed in various ways, depending on design, but are not limited thereto.

The COFs 130, which are films having various components on flexible base films 131, are components for supplying signals to the plurality of subpixels in the active area AA. The COFs 130 may be bonded to the plurality of pads disposed in the non-active area NA and supply a power voltage, a data voltage, a gate voltage, etc., respectively, to the plurality of subpixels in the active area AA through the pads. The COFs 130 include a base film 131 and a driving IC 132 and in addition to those, the COFs 130 may include various other components.

The base films 131 may be made of an insulating material, for example, an insulating material having flexibility, pliability.

The driving ICs 132 are components that process data for displaying images and driving signals for processing the data. Although the driving ICs 132 are mounted in the type of the COF 130 in FIG. 1, the driving ICs 132 are not limited thereto, and the driving ICs 132 may be mounted in the type of Chip On Glass (COG) or Tape Carrier Package (TCP).

Controllers such as a processing circuitry such as a microprocessor, microcontroller, integrated circuit (IC), IC chip, microchip and other circuitry may be mounted on the printed circuit board 140. A memory, a processor, etc., also may be mounted on the printed circuit board 140. The printed circuit board 140 transmits signals for driving the plurality of pixels from the controllers to the plurality of pixels.

The printed circuit board 140 is connected with the COFs 130, so they may be electrically connected with the plurality of subpixels on the plurality of second substrates 111.

The upper substrate 120 is a substrate on the lower substrate 110 to protect various components of the stretchable display device 100. In some embodiments, the upper substrate 120 overlaps with the lower substrate 110. The upper substrate 120, which is a flexible substrate, may be made of a bendable or stretchable insulating material. For example, the upper substrate 120 may be made of a flexible material and may be made of substantially the same material as the lower substrate 110, but is not limited thereto.

The polarizing layer 190, which is a component suppressing external light reflection by the stretchable display device 100, may overlap the upper substrate 120 and may be disposed on the upper substrate 120. However, the polarizing layer 190 is not limited thereto and, may be disposed under the upper substrate 120, or may not be provided, depending on the configuration of the stretchable display device 100.

Figure 2:
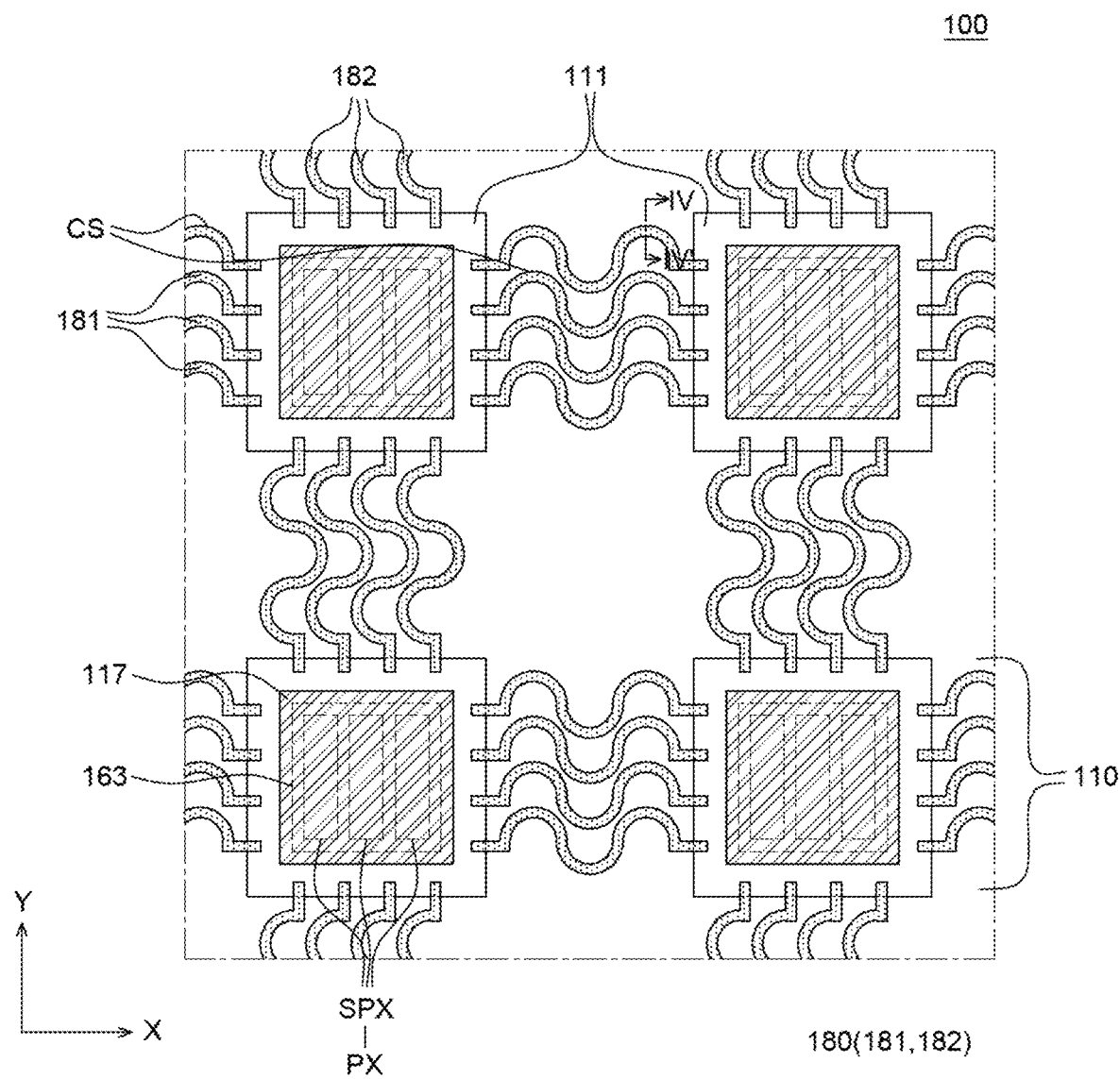
FIG. 2 is an enlarged plan view of the stretchable display device according to an embodiment of the present disclosure.
Figure 3:
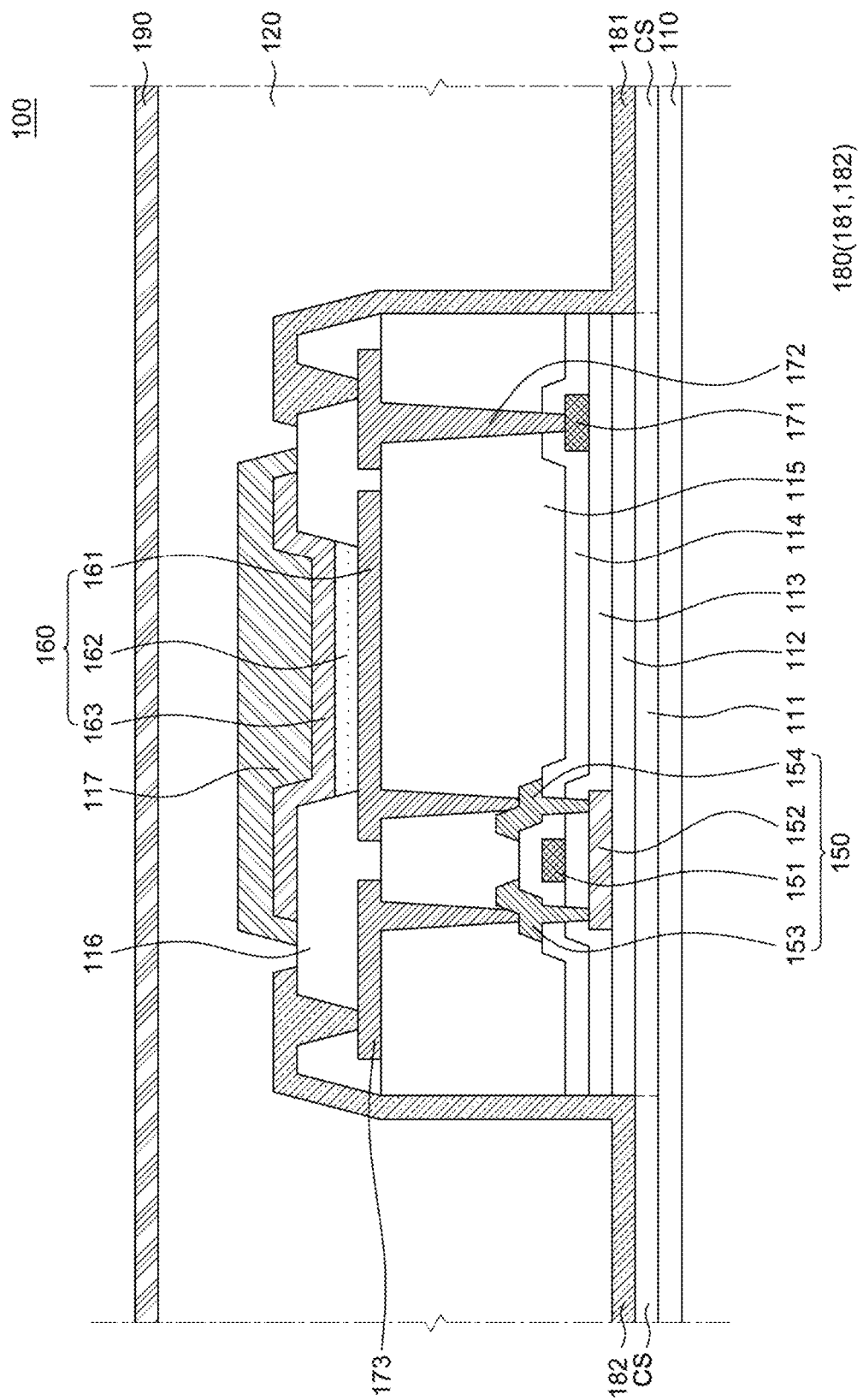
FIG. 3 is a schematic cross-sectional view of one subpixel shown in FIG. 1.

FIGS. 2 and 3 are referred to hereafter to describe in more detail the stretchable display device 100 according to an embodiment of the present disclosure.

FIG. 2 is an enlarged plan view of the stretchable display device 100 according to an embodiment of the present disclosure. FIG. 3 is a schematic cross-sectional view of a subpixel shown in FIG. 1. FIG. 1 is also referred to for the convenience of description.

Referring to FIGS. 2 and 3, a plurality of second substrates 111 is disposed on the lower substrate 110. The plurality of second substrates 111 is spaced apart from each other on the lower substrate 110. For example, the plurality of second substrates 111, as shown in FIGS. 1 and 2, may be disposed in a matrix shape on the lower substrate 110, but is not limited thereto.

Referring to FIG. 3, a buffer layer 112 is disposed on the plurality of second substrates 111. The buffer layer 112 is formed on the plurality of second substrates 111 to protect various components of the stretchable display device 100 against permeation of moisture, water ($H_2O$) and oxygen ($O_2$) from the outside of the lower substrate 110 and the plurality of second substrates 111. The buffer layer 112 may be made of an insulating material, and for example, may be a single inorganic layer or a multi-inorganic layer made of a silicon nitride (SiNx), a silicon oxide (SiOx), or silicon oxynitride (SiON). However, the buffer layer 112 may not be provided, depending on the structure or characteristics of the stretchable display device 100.

The buffer layer 112 may be formed only in the areas overlapped with the plurality of second substrates 111. As described above, since the buffer layers 112 may be made of an inorganic material, they may be easily damaged, such as cracking, when the stretchable display device 100 is stretched. Accordingly, the buffer layer 112 may be formed only on the plurality of second substrates 111 by patterning in a similar shape to the plurality of second substrates 111 except for the areas between the plurality of second substrates 111. Therefore, since the buffer layer 112 is formed only in the areas overlapped with the plurality of second substrates 111 that are relatively rigid substrates, it is possible to suppress damage to the buffer layer 112 even though the stretchable display device 100 according to an embodiment of the present disclosure is deformed, such as, being bent or stretched.

Referring to FIG. 3, a transistor 150 including a gate electrode 151, an active layer 152, a source electrode 153, and a drain electrode 154 is formed on the buffer layer 112.

First, referring to FIG. 3, the active layer 152 is disposed on the buffer layer 112. For example, the active layer 152 may be made of an oxide semiconductor or may be made of an Amorphous Silicon (a-Si) semiconductor, a Polycrystalline Silicon (poly-Si) semiconductor, or an organic semiconductor.

A gate insulating layer 113 is disposed on the active layer 152. The gate insulating layer 113, which is a layer for electrically insulating the gate electrode 151 and the active layer 152, may be made of an insulating material. For example, the gate insulating layer 113 may be a single layer of silicon nitride (SiNx) or silicon oxide (SiOx) that is an inorganic material, or a multi-layer of silicon nitride (SiNx) or silicon oxide (SiOx), but is not limited thereto.

The gate electrode 151 is disposed on the buffer layer 112. The gate electrode 151 is disposed to overlap the active layer 152. The gate electrode 151 may be made any one of various metals such as molybdenum (Mo), aluminum (Al), chromium (Cr), aurum (Au), titanium (Ti), nickel (Ni), neodymium (Nd), and copper (Cu), or an alloy of two or more of them, or may be a multi-layer of them, but is not limited thereto.

An inter-layer insulating layer 114 is disposed on the gate electrode 151. The inter-layer insulating layer 114, which is a layer for insulating the gate electrode 151, the source electrode 153, and the drain electrode 154, may be made of an inorganic material, equally to the buffer layer 112. For example, the inter-layer insulating layer 114 may be a single layer of silicon nitride (SiNx) or silicon oxide (SiOx) that is an inorganic material, or a multi-layer of silicon nitride (SiNx) or silicon oxide (SiOx), but is not limited thereto.

The source electrode 153 and the drain electrode 154 that are in contact with the active layer 152 are disposed on the inter-layer insulating layer 114. The source electrode 153 and the drain electrode 154 are spaced apart from each other on the same layer. The source electrode 153 and the drain electrode 154 may be electrically connected with the active layer 152 in contact with the active layer 152. The source electrode 153 and the drain electrode 154 may be made of any one of various metals such as molybdenum (Mo), aluminum (Al), chromium (Cr), aurum (Au), titanium (Ti), nickel (Ni), neodymium (Nd), and copper (Cu), or an alloy of two or more of them, or may be a multi-layer of them, but are not limited thereto.

In some embodiments, the gate insulating layer 113 and the inter-layer insulating layer 114 may be formed only in the areas overlapped with the plurality of second substrates 111 by patterning. The gate insulating layer 113 and the inter-layer insulating layer 114 may also be made of an inorganic material, equally to the buffer layer 112, so they may be easily damaged such as cracking when the stretchable display device 100 is stretched. Accordingly, the gate insulating layer 113 and the inter-layer insulating layer 114 may be formed only on the plurality of second substrates 111 by patterning in the shape of the plurality of second substrates 111 except for the areas between the second substrates 111.

Only a driving transistor among the various transistors that may be included in the stretchable display device 100 is shown in FIG. 3 for the convenience of description, but a switching transistor, a capacitor, etc., or other type of electronic components, circuitry may be included in the display device. Further, although the transistor 150 is described as having a coplanar structure in this specification, various transistors, for example, having a staggered structure also may be used.

Referring to FIG. 3, a gate pad 171 is disposed on the gate insulating layer 113. The gate pad 171 is a pad for transmitting a gate signal to a plurality of subpixels SPX. The gate pad 171 may be made of the same material as the gate electrode 151, but is not limited thereto.

Referring to FIG. 3, a planarization layer 115 is formed on the transistor 150 and the inter-layer insulating layer 114. The planarization layer 115 planarizes the top of the transistor 150. The planarization layer 115 may be composed of a single layer or a plurality of layers and may be made of an organic material. For example, the planarization layer 115 may be made of an acrylic-based organic material, but is not limited thereto. The planarization layer 115 may have a contact hole for electrically connecting the transistor 150 and an anode 161, a contact hole for electrically connecting a data pad 173 and the source electrode 153, and a contact hole for electrically connecting a connecting pad 172 and a gate pad 171.

In some embodiments, a passivation layer may be formed between the transistor 150 and the planarization layer 115. That is, the passivation layer covering the transistor 150 may be formed to protect the transistor 150 from permeation of foreign external materials such as moisture, water, oxygen, etc. The passivation layer may be made of an inorganic material and may be composed of a single layer or a plurality of layers, but is not limited thereto.

Referring to FIG. 3, the data pad 173, the connecting pad 172, and an organic light emitting element 160 are disposed on the planarization layer 115.

The data pad 173 may transmit a data signal from a connecting line 180, which functions as a data line, to a plurality of subpixels SPX. The data pad 173 is connected with the source electrode 153 of the transistor 150 through a contact hole formed at the planarization layer 115. The data pad 173 may be made of the same material as the anode 161 of the organic light emitting element 160, but is not limited thereto. The data pad 173 may be made of the same material as the source electrode 153 and the drain electrode 154 of the transistor 150, not on the planarization layer 115, but on the inter-layer insulating layer 114.

The connecting pad 172 may transmit a gate signal from a connecting line 180, which functions as a gate line, to a plurality of subpixels SPX. The connecting pad 172 is connected with the gate pad 171 through contact holes formed at the planarization layer 115 and the inter-layer insulating layer 114 and transmits a gate signal to the gate pad 171. The connecting pad 172 may be made of the same material as the data pad 173, but is not limited thereto.

The organic light emitting elements 160 are components disposed to correspond to a plurality of subpixel SPX, respectively, and emitted light having a specific wavelength band. That is, the organic light emitting element 160 may be a blue organic light emitting element that emits blue light, a red organic light emitting element that emits red light, a green organic light emitting element that emits green light, or a white organic light emitting element that emits white light, but is not limited thereto. When the organic light emitting element 160 is a white organic light emitting element, the stretchable display device 100 may further include a color filter. Although the stretchable display device 100 includes the organic light emitting element 160 herein, the present disclosure is not limited thereto and a light emitting diode (LED), particularly, a micro LED may be used as a light emitting component.

The organic light emitting element 160 includes an anode 161, an organic light emitting layer 162, and a cathode 163. In detail, the anode 161 is disposed on the planarization layer 115. The anode 161 is an electrode for supplying holes to the organic light emitting layer 162. The anode 161 may be made of a transparent conductive material with a high work function. The transparent conductive material may include an Indium Tin Oxide (ITO), an Indium Zinc Oxide (IZO), and an Indium Tin Zinc Oxide (ITZO). The anode 161 may be made of the same material as the data pad 173 and the connecting pad 172 disposed on the planarization layer 115, but is not limited thereto. When the stretchable display device 100 is implemented in a top emission type, the anode 161 may further include a reflective plate.

The anodes 161 are spaced apart from each other respectively for subpixels SPX and electrically connected with the transistor 150 through a contact hole of the polarization layer 115. For example, although the anode 161 is electrically connected with the drain electrode 154 of the transistor 150 in FIG. 3, the anode 161 may be electrically connected with the source electrode 153.

A bank 116 is formed on the anode 161, the data pad 173, the connecting pad 172, and the planarization layer 115. The bank 116 is a component separating adjacent subpixels SPX. The bank 116 is disposed to cover at least partially both sides of an adjacent anode 161, thereby partially exposing the top surface of the anode 161. The bank 116 may perform a role in suppressing the problem that an unexpected subpixel SPX emits light or colors are mixed by light emitted in the lateral direction of the anode 161 due to concentration of a current on the edge of the anode 161. The bank 116 may be made of acrylic-based resin, benzocyclobutene (BCB)-based resin, or polyimide, but is not limited thereto.

The bank 116 has a contact hole for connecting the connecting line 180 functioning as a data line and the data pad 173 and a contact hole for connecting the connecting line 180 functioning as a gate line and the connecting pad 172.

The organic light emitting layer 162 is disposed on the anode 161. The organic light emitting layer 162 is configured for emitting light. The organic light emitting layer 162 may include a luminescent material, and the luminescent material may include a phosphorous material or a fluorescent material, but is not limited thereto.

The organic light emitting layer 162 may be composed of one light emitting layer. Alternatively, the organic light emitting layer 162 may have a stacked structure in which a plurality of light emitting layers is stacked with a charge generation layer therebetween. The organic light emitting layer 162 may further include at least one organic layer of a hole transporting layer, an electron transporting layer, a hole blocking layer, an electrode blocking layer, a hole injection layer, and an electron injection layer.

Referring to FIGS. 2 and 3, the cathode 163 is disposed on the organic light emitting layer 162. The cathode 163 supplies electrons to the organic light emitting layer 162. The cathode 163 may be made of Indium Tin Oxide (ITO)-based, Indium Zin Oxide (IZO)-based, Indium Tin Zinc Oxide (ITZO)-based, Zinc Oxide (ZnO)-based, and Tin Oxide (TO)-based transparent conductive oxides or an Ytterbium (Yb) alloy. Alternatively, the cathode 163 may be made of a metal material.

The cathodes 163 may be formed by patterning to respectively overlap the plurality of second substrates 111. That is, the cathodes 163 may be disposed not in the areas between the plurality of second substrates 111, but only in the areas overlapped with the plurality of second substrates 111. Since the cathodes 163 are made of a material, such as, a transparent conductive oxide, a metal material, and the like, when the cathodes 163 are formed even in the areas between the plurality of second substrates 111, the cathodes 163 may be damaged when the stretchable display device 100 is stretched/contracted. Accordingly, the cathodes 163 may be formed to respectively correspond to the plurality of second substrates 111 in a plane. Referring to FIGS. 2 and 3, the cathodes 163 may be formed to have an area not overlapped with the area where a connecting line 180 is disposed, of the areas overlapped with the plurality of second substrates 111.

Unlike common organic light emitting display devices, the cathodes 163 are formed by patterning to correspond to the plurality of second substrates 111 in the stretchable display device 100 according to an embodiment of the present disclosure. Accordingly, the cathodes 163 disposed on the plurality of second substrates 111 may be independently supplied with low-potential power through the connecting lines 180.

Referring to FIGS. 2 and 3, an encapsulation layer 117 is disposed on the organic light emitting element 160. The encapsulation layer 117 may seal the organic light emitting element 116 by covering the organic light emitting element 160 in contact with a portion of the top surface of the bank 116. Accordingly, the encapsulation layer 117 protects the organic light emitting element 160 from water, air, or physical shock that may be applied from the outside.

The encapsulation layers 117 respectively cover the cathodes 163 patterned to respectively overlap the plurality of second substrates 111 and may be formed on the plurality of second substrates 111, respectively. That is, the encapsulation layer 117 is disposed to cover one cathode 163 on one second substrate 111 and the encapsulation layers 117 respectively disposed on the plurality of second substrates 111 may be spaced apart from each other.

The encapsulation layer 117 may be formed only in the areas overlapped with the plurality of second substrates 111. As described above, since the encapsulation layers 117 may include an inorganic layer, it may be easily damaged, such as cracking, when the stretchable display device 100 is stretched. In particular, since the organic light emitting element 160 is vulnerable to water or oxygen, when the encapsulation layer 117 is damaged, reliability of the organic light emitting element 160 may be reduced. Therefore, since the encapsulation layers 117 are not formed in the areas between the plurality of second substrates 111, damage to the encapsulation layers 117 may be reduced or minimized even though the stretchable display device 100 according to an embodiment of the present disclosure is deformed, such as, being bent or stretched.

Compared with flexible organic light emitting display devices of the related art, the stretchable display device 100 according to an embodiment of the present disclosure has a structure in which the plurality of second substrates 111 that is relatively rigid being disposed and spaced apart from each other on the lower substrate 110 that is relatively soft. The cathodes 163 and the encapsulation layers 117 of the stretchable display device 100 are patterned to correspond to the plurality of second substrates 111, respectively. That is, the stretchable display device 100 according to an embodiment of the present disclosure may have a structure that enables the stretchable display device 100 to be more easily deformed when a user stretches or bends the stretchable display device 100 and that may reduce or minimize damage to the components of the stretchable display device 100 when the stretchable display device 100 is deformed.

Referring to FIGS. 2 and 3, the connecting lines 180 mean lines for electrically connecting the pads on the plurality of second substrates 111. The connecting lines 180 are disposed on the plurality of connecting substrate CS. The connecting lines 180 may be disposed between the pads disposed on the plurality of second substrates 111 and may electrically connect the pads. The connecting lines 180 include first connecting lines 181 and second connecting lines 182. In the connecting lines 180, the plurality of connection lines 180 may include first connecting lines 181 and second connecting lines 182, the first connecting lines 181 may extend in a first direction, and the second connecting lines 182 may extend in a second direction perpendicular to the first direction. For example, the first connecting lines 181 may be lines extending in an X-axial direction of the connecting lines 180 and the second connecting lines 182 may be lines extending in a Y-axial direction of the connecting lines 180.

In common organic light emitting display devices, various lines such as a plurality of gate lines and a plurality of data lines are extended and disposed between a plurality of subpixels, and a plurality of subpixels are connected to one signal line. Accordingly, in common organic light emitting display devices, various lines such as gate lines, data lines, high-potential power lines, and reference voltage lines extend from a side to the other side of the organic light emitting display devices without disconnecting on the substrate.

However, in the stretchable display device 100 according to some embodiments of the present disclosure, various lines such as gate lines, data lines, high-potential power lines, and reference voltage lines, which are made of a metal material, are disposed only on the plurality of second substrates 111. That is, in the stretchable display device 100 according to some embodiments of the present disclosure, various lines made of a metal material may be disposed only on the plurality of second substrates 111 not in contact with the lower substrate 110. Accordingly, various lines may be patterned to correspond to the plurality of second substrates 111 and discontinuously disposed. However, in other embodiments, various lines made of a metal material may be disposed not only on the plurality of second substrates 111 but other suitable locations of the display device.

The connecting lines 180 may have a stacked structure of metal materials such as copper (Cu), aluminum (Al), titanium (Ti), and molybdenum (Mo), or metal materials such as copper/molybdenum-titanium (Cu/Moti) and titanium/aluminum/titanium (Ti/Al/Ti), but is not limited thereto.

In the stretchable display device 100 according to an embodiment of the present disclosure, the pads on two adjacent second substrates 111 may be connected by the connecting lines 180 to connect the discontinuous lines. That is, the connecting lines 180 electrically connect the pads on two adjacent second substrates 111. Accordingly, the stretchable display device 100 according to the present disclosure includes a plurality of connecting lines 180 to electrically connect various lines such as gate lines, data lines, high-potential power lines, and reference voltage lines between the plurality of second substrates 111. For example, gate lines may be disposed on a plurality of second substrates 111 disposed adjacent to each other in the X-axial direction, and the gate pad 171 may be disposed at both ends of the gate lines. The gate pads plurality of 171 on the plurality of second substrates 111 disposed adjacent to each other in the X-axial direction may be connected to each other by a connecting line 180 functioning as a gate line. Accordingly, the gate line disposed on the plurality of second substrates 111 and the connecting line 180 disposed on the connecting substrate CS may function as one gate line. All various lines that may be included in the stretchable display device 100, such as the data lines, high-potential power lines, and reference voltage lines, also each may function as one line by a connecting line 180, as described above.

Referring to FIG. 2, a first connecting line 181 may connect the pads on two parallel second substrates 111 of the pads on a plurality of second substrates 111 disposed adjacent to each other in the X-axial direction. The first connecting line 181 may function as a gate line or a low-potential power line, but is not limited thereto. For example, the first connecting line 181 may function as a gate line and may electrically connect the gate pads 171 on two X-axially parallel second substrates 111 through a contact hole formed at the bank 116. Accordingly, as described above, the gate pads 171 on a plurality of second substrates 111 disposed in the X-axial direction may be connected by first connecting lines 181 that function as gate lines, and one gate signal may be transmitted.

Referring to FIG. 2, a second connecting line 182 may connect the pads on two parallel second substrates 111 of the pads on a plurality of second substrates 111 disposed adjacent to each other in the Y-axial direction. The second connecting line 182 may function as a data line, a high-potential power line, or a reference voltage line, but is not limited thereto. For example, the second connecting line 182 may function as a data line and may electrically connect the data pads 173 on two Y-axially parallel second substrates 111 through a contact hole formed at the bank 116. Accordingly, as described above, the data pads 173 on a plurality of second substrates 111 disposed in the Y-axial direction may be connected by the plurality of second connecting lines 182 that function as data lines, and one data signal may be transmitted.

The connecting lines 180 may be made of a conductive material. For example, the connecting lines 180 may be made of a metal material, but is not limited thereto and may include a base polymer and conductive particles distributed in the base polymer. In addition, as shown in FIG. 2, the shape of the connection lines 180 may follow the shape of the connecting substrates CS in a plan view.

The first connecting line 181 may extend to the top surface of the connecting substrate CS in contact with the top surface and a side of the bank 116, and sides of the planarization layer 115, the inter-layer insulating layer 114, and the buffer layer 112 that are disposed the second substrate 111. Accordingly, the first connecting line 181 may be in contact with the top surface of a connecting substrate CS, and sides of the buffer layers 112, the gate insulating layers 113, the inter-layer insulating layers 114, the planarization layers 115, and the banks 116 disposed on adjacent second substrates 111. The first connecting line 181 may be in contact with the connecting pads 172 disposed on adjacent second substrates 111, but is not limited thereto.

Referring to FIG. 3, the second connecting line 182 may extend to the top surface of the connecting substrate CS in contact with the top surface and a side of the bank 116, and sides of the planarization layer 115, the inter-layer insulating layer 114, and the buffer layer 112 that are disposed on the second substrate 111. Accordingly, the second connecting line 182 may be in contact with the top surface of a connecting substrate CS, and sides of the buffer layers 112, the gate insulating layers 113, the inter-layer insulating layers 114, the planarization layers 115, and the banks 116 disposed on adjacent second substrates 111. The second connecting line 182 may be in contact with the data pads 173 disposed on adjacent second substrates 111, but is not limited thereto.

Referring to FIG. 3 again, the upper substrate 120 and the polarizing layer 190 are disposed on the encapsulation layer 117 and the lower substrate 110.

The upper substrate 120 is a substrate supporting various components disposed under the upper substrate 120. In detail, the upper substrate 120 may be formed by coating a material constituting the upper substrate 120 onto the lower substrate 110 and the second substrate 111 and then hardening the substrate. Accordingly, the upper substrate 120 may be disposed in contact with the lower substrate 110, the second substrate 111, the connecting substrate CS, and the connecting line 180.

The upper substrate 120, which is a flexible substrate, may be made of a bendable or stretchable insulating material. The upper substrate 120, which is a flexible substrate, may reversibly expand and contract. The upper substrate 120 may have an elastic modulus of several to hundreds of MPa and a tensile fracture rate of about 100% or more. The thickness of the upper substrate 120 may be about 10 μm to 1 mm, but is not limited thereto.

The upper substrate 120 may be made of a material having a smaller modulus than the plurality of connecting substrates CS. For example, the upper substrate 120 may be made of the same material as the lower substrate 110 and may be made silicon rubber such as polydimethylsiloxane (PDMS) or an elastomer such as polyurethane (PU) and polytetrafluoroethylene (PTFE), so it may have flexibility. The material of the upper substrate 120, however, is not limited thereto.

The polarizing layer 190 is disposed on the upper substrate 120. The polarizing layer 190 may polarize light incident into the stretchable display device 100 from the outside. Light incident and polarized in the stretchable display device 100 through the polarizing layer 190 may be reflected in the stretchable display device 100, so the phase of the light may be changed. The light with the changed phase may not pass through the polarizing layer 190. Accordingly, light incident in the stretchable display device 100 from the outside of the stretchable display device 100 is not discharged back to the outside of the stretchable display device 100, so the external light reflection of the stretchable display device 100 may be reduced.

A stretchable display device needs an easily bending or stretching characteristic, so there have been attempts to use substrates that have a flexible property due to a small modulus. However, when a soft material such as polydimethylsiloxane (PDMS) having a small modulus is used as a lower substrate that is disposed in the process of manufacturing light emitting elements, there is a problem that the substrate is damaged by high temperature, for example, temperature over 100° C. that is generated in the process of forming transistors and the light emitting elements due to the characteristic that a material having a small modulus is weak to heat.

Accordingly, light emitting elements should be formed on a substrate made of a material that may withstand high temperature, so damage to the substrate may be suppressed in the process of manufacturing the light emitting elements. Accordingly, there have been attempts to manufacture a substrate using materials that may withstand high temperature, which is generated in the manufacturing process, such as polyimide (PI). However, materials that may withstand high temperature are not soft due to large moduli, so substrates are not easily bent or stretched when stretching the stretchable display devices because the materials do not have flexible properties.

Therefore, since the plurality of second substrates 111 that are rigid substrates are disposed only in the areas where transistors 150 or organic light emitting elements 160 are disposed in the stretchable display device 100 according to an embodiment of the present disclosure, damage to the plurality of second substrates 111 due to high temperature in the process of manufacturing the transistors 150 or the organic light emitting elements 160 may be suppressed.

Further, the lower substrate 110 and the upper substrate 120 that are flexible substrates may be disposed under and over the plurality of second substrates 111 in the stretchable display device 100 according to an embodiment of the present disclosure. Accordingly, the other areas of the lower substrate 110 and the upper substrate 120 excepting the areas overlapped with the plurality of second substrates 111 may be easily stretched or bent, so the stretchable display device 100 may be achieved. Further, it is possible to suppress the damage of the stretchable display device 100 by the transistors 150, the organic light emitting elements 160, etc., disposed on the plurality of second substrates 111 that are rigid substrates when the stretchable display device 100 is bent or stretched.

Figure 4:
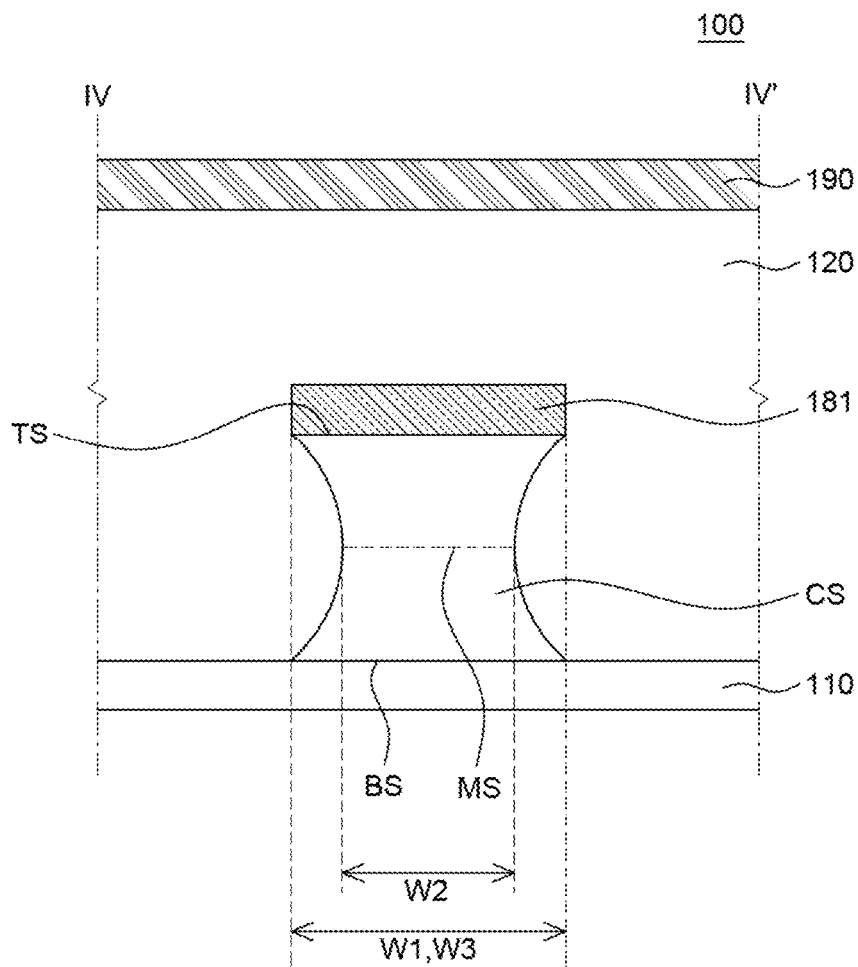
FIG. 4 is a cross-sectional view taken along line IV-IV' of FIG. 2.

The shape of the connecting substrates CS for attenuating stress that is generated when the stretchable display device 100 according to an embodiment of the present disclosure is stretched is described hereafter in more detail with reference to FIG. 4.

FIG. 4 is a cross-sectional view taken along line IV-IV' of FIG. 2.

Referring to FIG. 4 and FIG. 2, the third substrate (or connecting substrates CS) has a top surface TS and a bottom surface BS, and the horizontal cross sectional area of connecting substrates CS may vary from the top surface TS to the bottom surface BS. For example, the width (in cross-section view in FIG. 4) of the connecting substrates CS may decrease away from the top surface TS of the plurality of connecting substrates CS. Accordingly, the plurality of connecting substrates CS has a portion of which the cross sectional area decreases toward the lower substrate 110 from the top surface TS. That is, the horizontal cross-sectional area of the plurality of connecting substrates CS may decrease as it moves away from the top surface TS. The widths W1, W2, and W3 of the plurality of connecting substrates CS may be defined as widths in a direction perpendicular to the longitudinal direction the connecting substrates CS.

Referring to FIG. 4, the width W2 of a middle portion MS defined between the top surface TS and the bottom surface BS of the plurality of connecting substrates CS may be narrow than the width W1 of the top surface TS and the width W3 of the bottom surface BS of the plurality of connecting substrates CS. The middle portion MS, which is a predetermined surface positioned between the top surface TS and the bottom surface BS of the plurality of connecting substrates CS, may be determined as the surface with the smallest width of surfaces positioned between the top surface TS and the bottom surface BS of the plurality of connecting substrates CS.

Accordingly, the horizontal cross-sectional area may be the smallest at the middle portion MS and may increase toward the top surface TS and the bottom surface BS from the middle portion MS. In detail, the width of the plurality of connecting substrates CS may decrease toward the middle portion MS from the top surface TS of the plurality of connecting substrates CS, and may increase toward the bottom surface BS from the middle portion MS of the plurality of connecting substrates CS. That is, the plurality of connecting substrates CS have the smallest width W2 at the middle portion MS, so, for example, the plurality of connecting substrates CS may have an hourglass-shaped cross-section. Although the width W1 of the top surface TS and the width W3 of the bottom surface BS of the plurality of connecting substrates CS are the same in FIG. 4, they are not limited thereto, and the width W1 of the top surface TS and the width W3 of the bottom surface BS of the plurality of connecting substrates CS may be different. Further, the middle portion MS of the plurality of connecting substrates CS is defined at the middle between the top surface TS and the bottom surface BS of the plurality of connecting substrates CS in FIG. 4, but it is not limited thereto. The middle portion MS of the plurality of connecting substrates CS may be defined to be closer to the top surface TS of the plurality of connecting substrates CS or may be defined to be closer to the bottom surface BS of the plurality of connecting substrates CS.

Referring to FIG. 4, the upper substrate 120 may be disposed in contact with the sides of the plurality of connecting substrates CS. Since the plurality of connecting substrates CS has an hourglass-shaped cross-section, grooves recessed inward may be formed on the sides of the plurality of connecting substrates CS. Accordingly, the upper substrate 120 may fill the grooves formed on the sides of the plurality of connecting substrates CS by being coated and hardened over the plurality of connecting substrates CS. Thus, stress that is applied to the plurality of connecting substrates CS when the stretchable display device 100 is stretched may be reduced. The grooves formed on the sides of the plurality of connecting substrates CS may have a semicircular shape or an elliptical shape, but they are not limited thereto.

Referring to FIG. 2, the top surface TS of the plurality of connecting substrates CS is the same in width as the connecting line 180, but is not limited thereto. That is, the top surface of the plurality of connecting substrates CS may have a larger width than the connecting line 180.

A plurality of connecting substrates has a constant width from the top surface to the bottom surface in common stretchable display devices. In this case, when the stretchable display devices are stretched, the plurality of connecting substrates may be damaged by stress applied thereto, so a plurality of connecting lines disposed on the plurality of connecting substrates also may be damaged. That is, the plurality of connecting substrates are only horizontally stretched without vertically moving when the stretchable display devices are stretched. Accordingly, the stress applied to the plurality of connecting substrates and the connecting lines is not attenuated, so the plurality of connecting substrates and connecting lines may be damaged.

Accordingly, the width of the plurality of connecting substrates CS is made to decrease as being away from the top surface TS of the plurality of connecting substrates CS in the stretchable display device 100 according to an embodiment of the present disclosure. Therefore, the stress that is applied to the plurality of connecting substrates CS and the connecting lines 180 when the stretchable display device 100 is stretched may be reduced. In detail, the width of the plurality of connecting substrates CS may decrease toward the middle portion MS from the top surface TS of the plurality of connecting substrates CS and may increase toward the bottom surface BS from the middle portion MS of the plurality of connecting substrates CS. Accordingly, the top surface TS of the connecting substrates CS may move within the area where the grooves recessed inward are formed on the sides of the plurality of connecting substrates CS between the top surface TS and the bottom surface BS of the plurality of connecting substrates CS. That is, when the stretchable display device 100 is stretched, the plurality of connecting substrates CS may be horizontally stretched and vertically moved. In detail, there are grooves, which enable the top surface TS of the plurality of connecting substrates CS to vertically move or twist, under the top surface TS of the plurality of connecting substrates CS. Accordingly, when the stretchable display device 100 is stretched, the stress that is applied to the plurality of connecting substrates CS and the connecting lines 180 may be attenuated by the vertical movement of the top surface TS of the connecting substrates CS.

Further, the upper substrate 120 is disposed to be in contact with the sides of the plurality of connecting substrates CS in the stretchable display device 100 according to an embodiment of the present disclosure. Accordingly, the stress that is applied to the plurality of connecting substrates CS when the stretchable display device 100 is stretched is reduced. In detail, since the plurality of connecting substrates CS has an hourglass-shaped cross-section, grooves recessed inward may be formed on the sides of the plurality of connecting substrates CS and filled with the upper substrate 120. As described above, since the modulus of the upper substrate 120 is lower than that of the connecting substrates CS, the upper substrate 120 may function as a cushion that absorbs the stress that is applied to the connecting substrates CS when the stretchable display device 100 is stretched. Therefore, the upper substrate 120 may reduce the stress that is applied to the plurality of connecting substrates CS and the plurality of connecting lines 180.

Figure 5A:
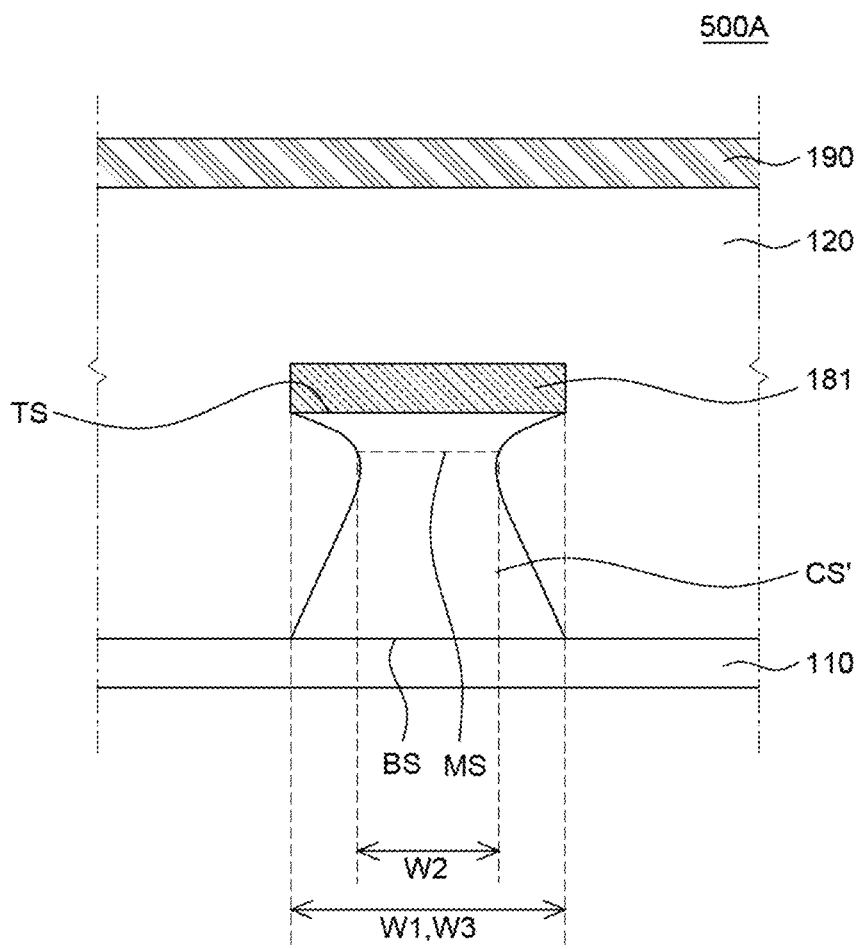
FIGS. 5A and 5B are cross-sectional views of stretchable display devices according to various embodiments of the present disclosure.
Figure 5B:
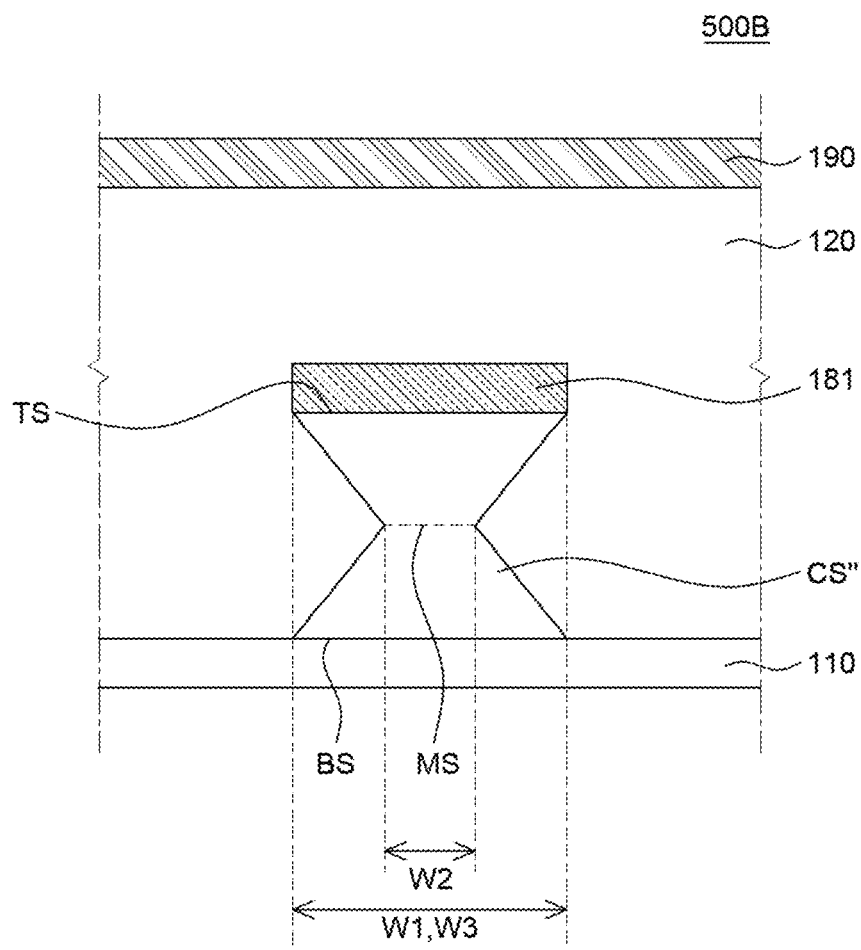

FIGS. 5A and 5B are cross-sectional views of stretchable display devices according to various embodiments of the present disclosure. Stretchable display devices 500A and 500B of FIGS. 5A and 5B are substantially the same as the stretchable display device 100 shown in FIGS. 1 to 4 except for having different connecting substrates CS' and CS", so repeated description is not provided.

Referring to FIG. 5A, a middle portion MA of a plurality of connecting substrates CS' may be defined closer to the top surface TS of the plurality of connecting substrates CS'. In detail, the plurality of connecting substrates CS' may be disposed on a lower substrate 110, a plurality of first connecting lines 181 may be disposed on the plurality of connecting substrates CS', and then the sides of the plurality of connecting substrates CS' may be etched. Accordingly, the plurality of connecting substrates CS' may be removed much at the upper portion than the lower portion, so the plurality of connecting substrates CS' may have the shape shown in FIG. 5A. Further, the middle portion MA of the plurality of connecting substrates CS' can be defined closer to the top surface TS of the connecting substrates CS'.

Referring to FIG. 5B, the sides of a plurality of connecting substrates CS" may have an angular shape. The cross-section (or the cross-section from the top surface to the bottom surface of the connecting substrate) may have an angular shape as well. For example, the angular shape may have a cross-sectional shape having two trapezoids connected together where the top trapezoid is mounted upside down on the bottom trapezoid. A middle portion MS of the plurality of connecting substrates CS" is disposed at the middle between the top surface TS and the bottom surface BS of the plurality of connecting substrates CS" in FIG. 5B, but is not limited thereto. The middle portion MS of the plurality of connecting substrates CS" may be disposed closer to the top surface TS of the plurality of connecting substrates CS" or closer to the bottom surface BS of the plurality of connecting substrates CS".

Figure 6:
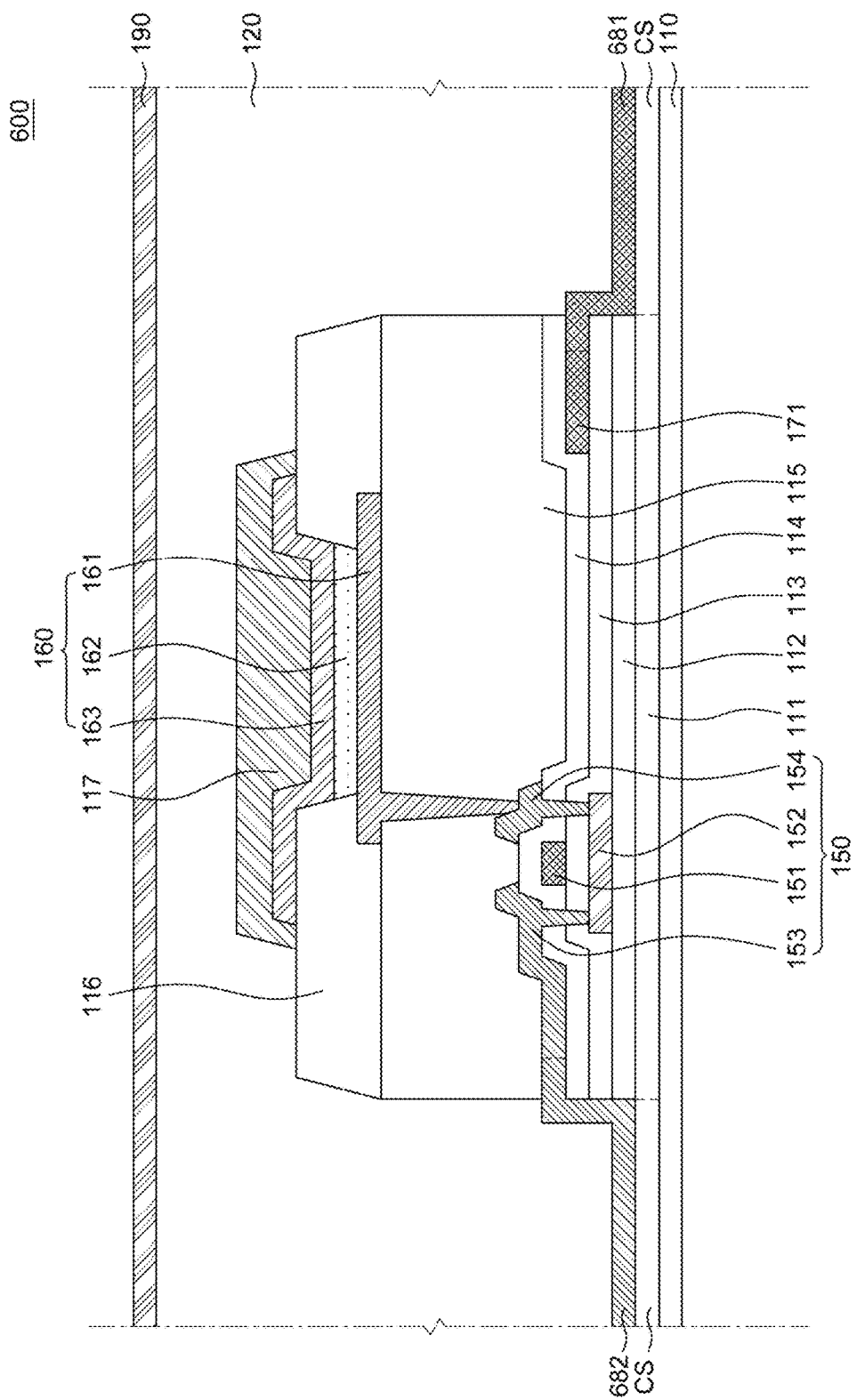
FIG. 6 is a schematic cross-sectional view of one subpixel of a stretchable display device according to another embodiment of the present disclosure.

FIG. 6 is a schematic cross-sectional view of one subpixel of a stretchable display device 600 according to another embodiment of the present disclosure. The stretchable display device 600 of FIG. 6 is substantially the same as the stretchable display device 100 shown in FIGS. 1 to 4 except for having a plurality of different connecting lines 680 including a first connecting line 681 and a second connecting line 682, so repeated description is not provided.

Referring to FIG. 6, a gate pad 171 is formed on a gate insulating layer 113 and a first connecting line 681 is formed on the gate insulating layer 113 and a plurality of connecting substrates CS.

Referring to FIG. 6, the first connecting line 681 that may function as a gate line is connected with the gate pad 171 and extends from the top surface of the gate insulating layer 113 to the top surface of the plurality of connecting substrates CS. Accordingly, the first connecting lines 681 may electrically connect the gate pads 171 formed on each of the adjacent second substrates 111. The first connecting lines 681 are in contact with the plurality of connecting substrates CS between the plurality of second substrates 111.

The first connecting line 681 and the gate pad 171 may be made of the same material as a gate electrode 151. Accordingly, the first connecting line 681 and the gate pad 171 may be simultaneously formed in the same process as the gate electrode 151. Accordingly, the first connecting line 681 may be integrally formed to extend from the gate pad 171. However, the first connecting line 681 is not limited thereto and may be made of the same material as other components excepting the gate electrode 151 of various conductive components disposed on the second substrates 111.

Referring to FIG. 6, a second connecting line 682 that may function as a data line is formed on an inter-layer insulating layer 114. A source electrode 153 may extend outside the second substrate 111, may function as a data pad, and may be electrically connected with the second connecting line 682. However, the present disclosure is not limited thereto and a separate pad may extend from the source electrode 153 or may be electrically connected with the source electrode 153.

The second connecting line 682 is connected with the source electrode 153 and extends from the top surface of an adjacent second substrate 111 to the plurality of connecting substrates CS. Accordingly, the second connecting line 682 may electrically connect the data pads formed on each of the adjacent second substrates 111. The second connecting lines 682 are in contact with the plurality of connecting substrates CS between the plurality of second substrates 111.

The second connecting line 682 may be made of the same material as a data pad, that is, the source electrode 153. Accordingly, the second connecting line 682, the source electrode 153, and the drain electrode 154 may be simultaneously formed in the same process. Accordingly, the second connecting line 682 may be integrally formed to extend from the source electrode 153. However, the second connecting line 682 is not limited thereto and may be made of the same material as other components excepting the source electrode 153 of various conductive components disposed on the second substrates 111.

In the stretchable display device 600 according to still another embodiment of the present disclosure, the connecting lines 680 electrically connecting pads formed on the plurality of second substrates 111, such as the first connecting line 681 and the second connecting line 682, may be made of substantially the same material as at least one of a plurality of conductive components disposed on the plurality of second substrates 111. For example, the first connecting line 681 may be made of the same material as the gate electrode 151 and the second connecting line 682 may be made of the same material as the source electrode 153. However, the present disclosure is not limited thereto and the connecting lines 680 may be made of the same materials as, other than the gate electrode 151 and the source electrode 153, a drain electrode 154, the electrodes of an organic light emitting element 160 such as an anode 161 and a cathode 163 of the organic light emitting element 160, and various lines included in the stretchable display device 600. Accordingly, the connecting lines 680 may be simultaneously formed in the manufacturing process of conductive components made of the same material as the connecting lines 680 and disposed on the plurality of second substrates 111 in the stretchable display device 600 according to still another embodiment of the present disclosure. Therefore, there may not be a need for a separate manufacturing process for forming the connecting lines 680.

Figure 7A:
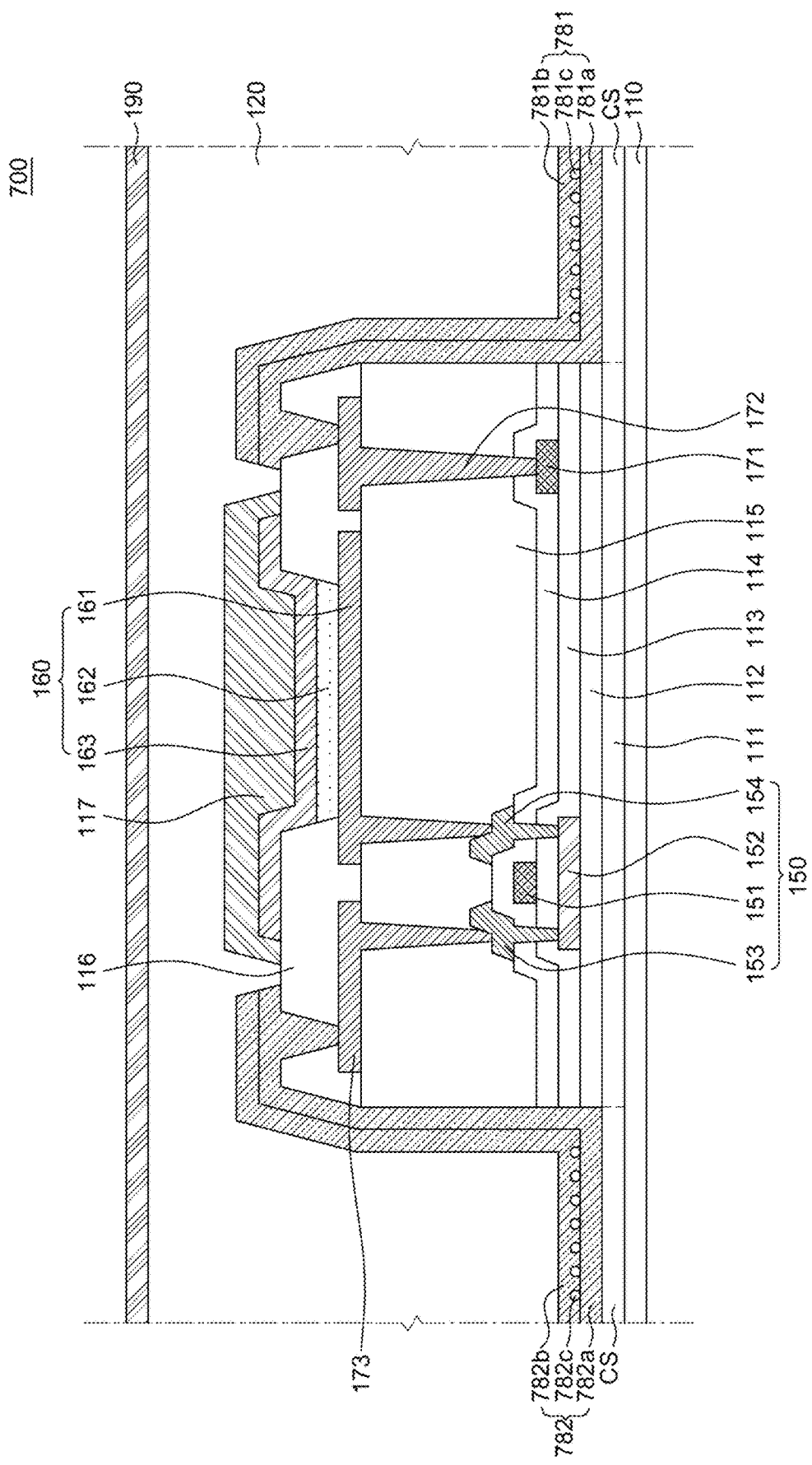
FIG. 7A is a schematic cross-sectional view of one subpixel of a stretchable display device according to still another embodiment of the present disclosure.
Figure 7B:
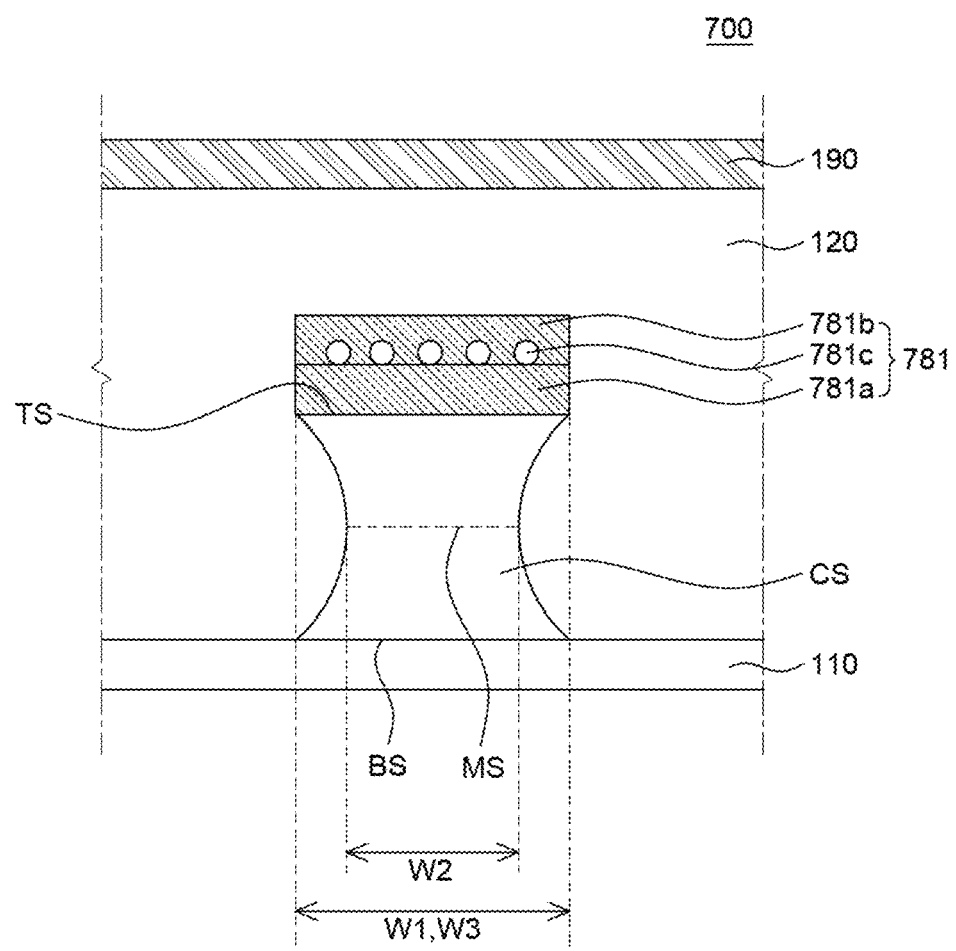
FIG. 7B is a schematic cross-sectional view illustrating connecting lines of a stretchable display device according to still another embodiment of the present disclosure.

FIG. 7A is a schematic cross-sectional view of one subpixel of a stretchable display device 700 according to still another embodiment of the present disclosure. FIG. 7B is a schematic cross-sectional view illustrating connecting lines of a stretchable display device 700 according to still another embodiment of the present disclosure. A stretchable display device 700 of FIGS. 7A and 7B is substantially the same as the stretchable display device 100 shown in FIGS. 1 to 4 except for having a plurality of different connecting lines 780, so redundant description is omitted.

Referring to FIGS. 7A and 7B, a plurality of connecting lines 780 may be composed of a plurality of layers. In detail, a first connecting line 781 of the plurality of connecting lines 780 may have a first layer 781a and a second layer 781b on the first layer 781a. A second connecting line 782 of the plurality of connecting lines 780 may have a first layer 782a and a second layer 782b on the first layer 782a. The first layers 781a and 782a and second layers 781b and 782b all may be made of a metal material. Although the plurality of connecting lines 780 each have a two-layered structure in FIGS. 7A and 7B, respectively, the plurality of connecting lines 780 is not limited thereto and each may be composed of three layers or more, depending on the design of the display devices.

Referring to FIGS. 7A and 7B, the plurality of connecting lines 780 may further include a plurality of flexible particles 781c and 782c between the first layers 781a and 782a and second layers 781b and 782b. In detail, the plurality of flexible particles 781c and 782c may be disposed on the first layers 781a and 782a disposed on a plurality of connecting substrates CS, and the second layers 781b and 782b may be disposed on the first layers 781a and 782a and the plurality of flexible particles 781c and 782c. In detail, referring to FIG. 7B, the plurality of flexible particles 781c may be distributed on the first layer 781a of the first connecting line 781 and then the second layer 781b may be formed to cover the first layer 781a and the plurality of flexible particles 781c. Further, the second connecting line 782 may be formed in substantially the same way as the first connecting line 781.

A elastic modulus of the plurality of flexible particles 781c and 782c may be formed to be about 1 Mpa or less. The plurality of flexible particles 781c and 782c may be made of a material that may stretch and contract, such as a silicon rubber including styrene butadiene styrene (SBS), ecoflex, and polydimethylsiloxane (PDMS), an elastomer including polyurethane (PU) and polytetrafluoroethylene (PTFE), or a metal-based flexible material including iron (Fe), copper (Cu), and aluminum (Al), but is not limited thereto. In other embodiments, the plurality of flexible particles 781c and 782c may be made of synthetic rubbers, plastic, thermoset, thermoplastics or any other material having suitable pliability or other properties for flexibly stretching and contracting during use.

Since the plurality of connecting lines 780 include the plurality of flexible particles 781c and 782c, respectively, in the stretchable display device 700 according to still another embodiment of the present disclosure, it is possible to reduce damage to the plurality of connecting lines 780 when the stretchable display device 700 is stretched. In detail, since the plurality of flexible particles 781c and 782c is made of a material with a flexible property, it may be stretched when the stretchable display device 700 is stretched. Accordingly, when the plurality of flexible particles 781c and 782c is disposed in the plurality of connecting lines 780, the plurality of flexible particles 781c and 782c disposed in the plurality of connecting lines 780 may be correspondingly stretched with stretching of the stretchable display device 700. Therefore, damage to the plurality of connecting lines 780 when the stretchable display device 700 is stretched is reduced.

Figure 8A:
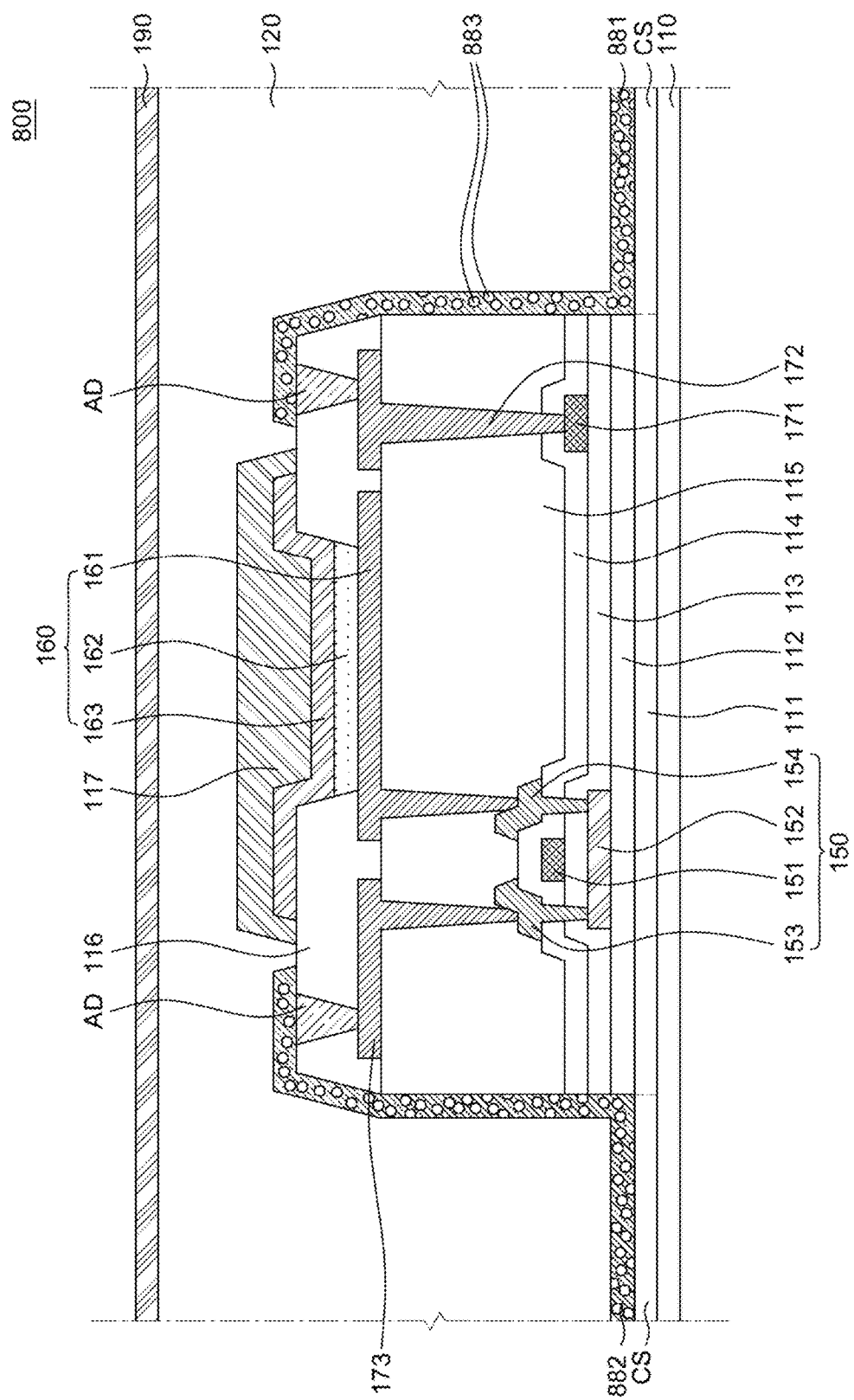
FIG. 8A is a schematic cross-sectional view of one subpixel of a stretchable display device according to still another embodiment of the present disclosure.
Figure 8B:
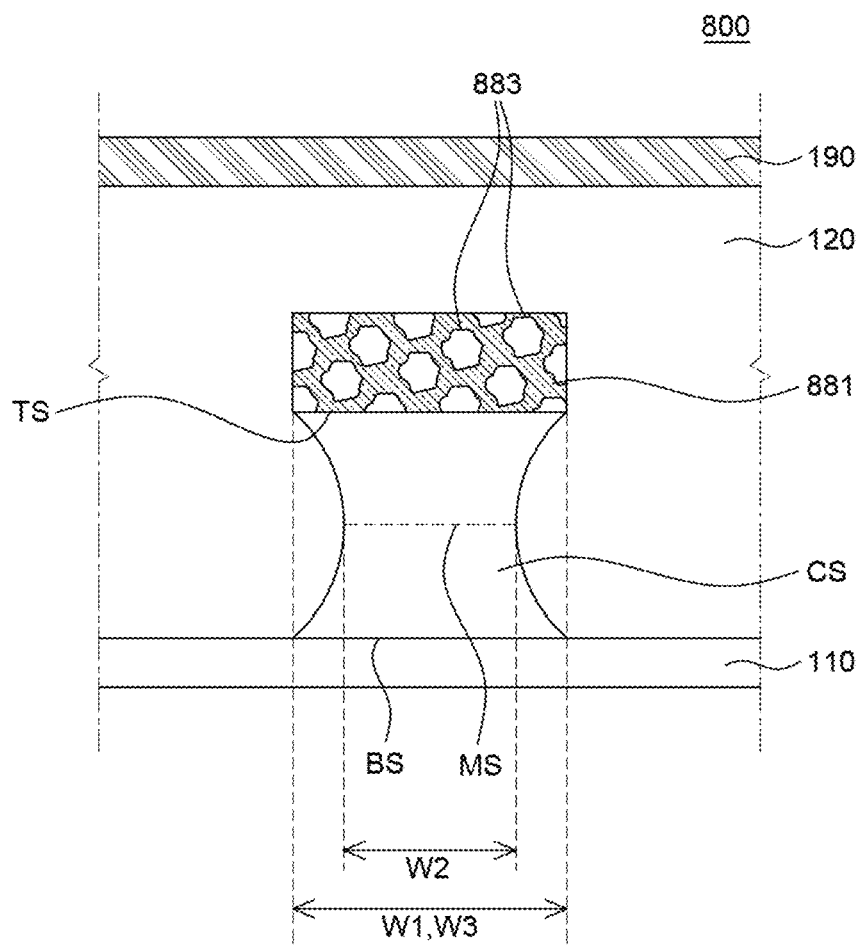
FIG. 8B is a schematic cross-sectional view illustrating connecting lines of a stretchable display device according to still another embodiment of the present disclosure.

FIG. 8A is a schematic cross-sectional view of one subpixel of a stretchable display device 800 according to still another embodiment of the present disclosure. FIG. 8B is a schematic cross-sectional view illustrating connecting lines of a stretchable display device 800 according to still another embodiment of the present disclosure. A stretchable display device 800 of FIGS. 8A and 8B is substantially the same as the stretchable display device 100 shown in FIGS. 1 to 4 except for having a plurality of different connecting lines 880, accordingly redundant description is omitted.

Referring to FIGS. 8A and 8B, when a plurality of connecting lines 880 is made of a metal material, they have a net structure including a plurality of air gaps 883. In detail, a first connecting line 881 and a second connecting line 882 of the plurality of connecting lines 880 include a plurality of gaps 883 on the surface and therein, so they may have a cross-sectional shape like a sponge. In one or more embodiments, the plurality of gaps 883 may comprehensively include holes, air gaps, air capsules, void space or the like. Accordingly, the plurality of connecting lines 880 may be made of a sponge-like metal sheet by having gaps 883 within the connecting lines 880 to form a net-like shape or structure. When the plurality of connecting lines 880 is made of a metal sheet, it is possible to electrically connect the plurality of connecting lines 880 to a connecting pad 172 and a data pad 173 by applying an adhesive AD mixed with a conductive material such as silver paste to the connecting pad 172 and the data pad 173.

The plurality of connecting line 880 having a net structure including the plurality of air gaps 883 may be manufactured in various ways. For example, the connecting lines 880 may be manufactured by mixing PVA, a polymer binder, and metal powder on a temporary substrate and then performing sintering process. However, the manufacturing process of the connecting line 880 is not limited thereto.

Since the plurality of connecting lines 880 has a net structure including the plurality of air gaps 883 in the stretchable display device 800 according to still another embodiment of the present disclosure, it is possible to reduce damage to the plurality of connecting lines 880 when the stretchable display device 800 is stretched. In detail, when the plurality of connecting lines 880 has a net structure including the plurality of air gaps 883, the plurality of connecting lines 880 may have elasticity in the same principle as a sponge having elasticity. Accordingly, by forming the plurality of air gaps 883 in the plurality of connecting lines 880, the plurality of connecting lines 880 can be more easily stretched when the stretchable display device 800 is stretched. Further, stress that is applied to the plurality of connecting lines 880 is reduced and damage to the plurality of connecting lines 880 is also reduced when the stretchable display device 800 is stretched.

Figure 9A:
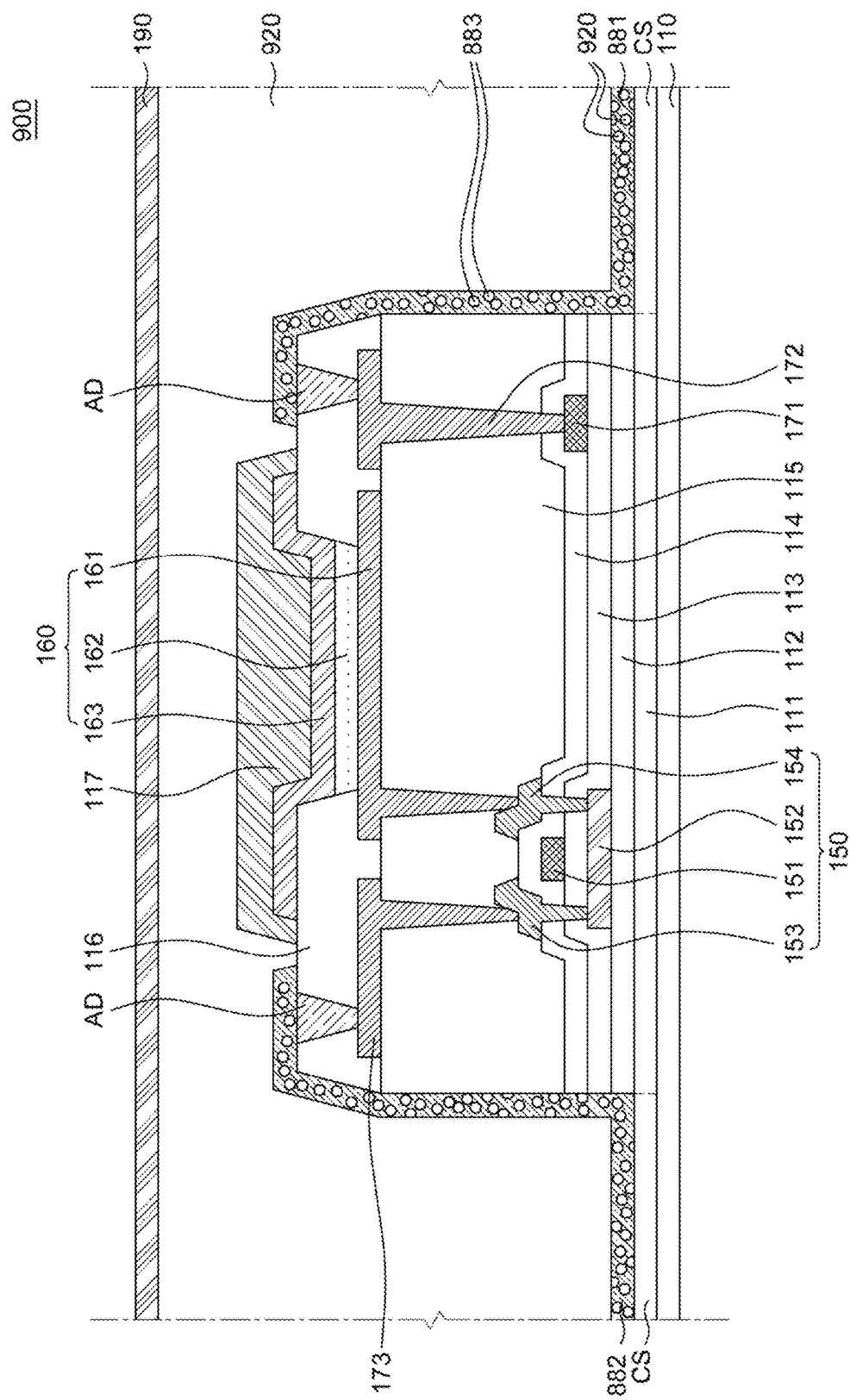
FIG. 9A is a schematic cross-sectional view of one subpixel of a stretchable display device according to still another embodiment of the present disclosure.
Figure 9B:
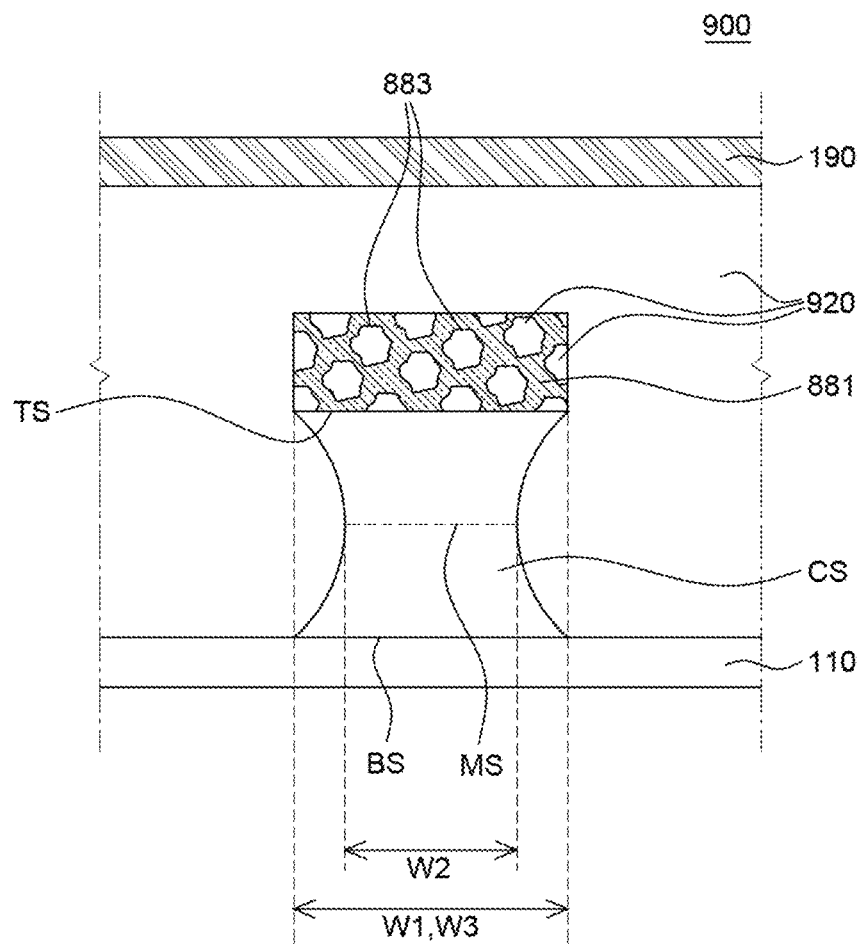
FIG. 9B is a schematic cross-sectional view illustrating connecting lines of a stretchable display device according to still another embodiment of the present disclosure.

FIG. 9A is a schematic cross-sectional view of one subpixel of a stretchable display device 900 according to still another embodiment of the present disclosure. FIG. 9B is a schematic cross-sectional view illustrating connecting lines of a stretchable display device 900 according to still another embodiment of the present disclosure. A stretchable display device 900 of FIGS. 9A and 9B is substantially the same as the stretchable display device 800 shown in FIGS. 8A and 8B except for having a different upper substrate 920, accordingly redundant description is omitted.

Referring to FIGS. 9A and 9B, an upper substrate 920 may be disposed to fill a plurality of air gaps 883 of a plurality of connecting lines 880. In detail, as described above, since the upper substrate 920 is formed through coating and hardening, the upper substrate 920 may fill the plurality of air gaps 883 of the plurality of connecting lines 880. Accordingly, it is possible to reduce stress that is applied to a plurality of connecting substrates CS when the stretchable display device 900 is stretched. Although the upper substrate 920 was described as filling all the plurality of air gaps 883 of the plurality of connecting lines 880 with reference to FIGS. 9A and 9B, the upper substrate 920 is not limited thereto and may be disposed to partially fill the plurality of connecting lines 880.

Since the upper substrate 920 is disposed to fill the plurality of air gaps 883 of the plurality of connecting lines 880 in the stretchable display device 900 according to still another embodiment of the present disclosure, it is possible to reduce damage to the plurality of connecting lines 880 when the stretchable display device 900 is stretched. In detail, since the upper substrate 920 is made of a material with a flexible property, when the upper substrate 920 fills the plurality of air gaps 883 of the plurality of connecting lines 880, it may absorb stress that is applied to the plurality of connecting lines 880 when the stretchable display device 900 is stretched. Accordingly, when the stretchable display device 900 is stretched, stress that is applied to the plurality of connecting lines 880 is reduced and damage to the plurality of connecting lines 880 is also reduced.

Further, since the upper substrate 920 is disposed to fill the plurality of air gaps 883 of the plurality of connecting lines 880 in the stretchable display device 900 according to still another embodiment of the present disclosure, it is possible to improve reliability of the plurality of connecting lines 880. If air or otherwise foreign external materials such as moisture, oxygen, or water permeates into the plurality of air gap 883, damage such as oxidation of the plurality of connection line 880 may be generated. Accordingly, the air gaps 883 of the plurality of connecting lines 880 are filled with the upper substrate 920 in the stretchable display device 900 according to still another embodiment of the present disclosure, thereby being able to improve reliability of the plurality of connecting lines 880.

Figure 10:
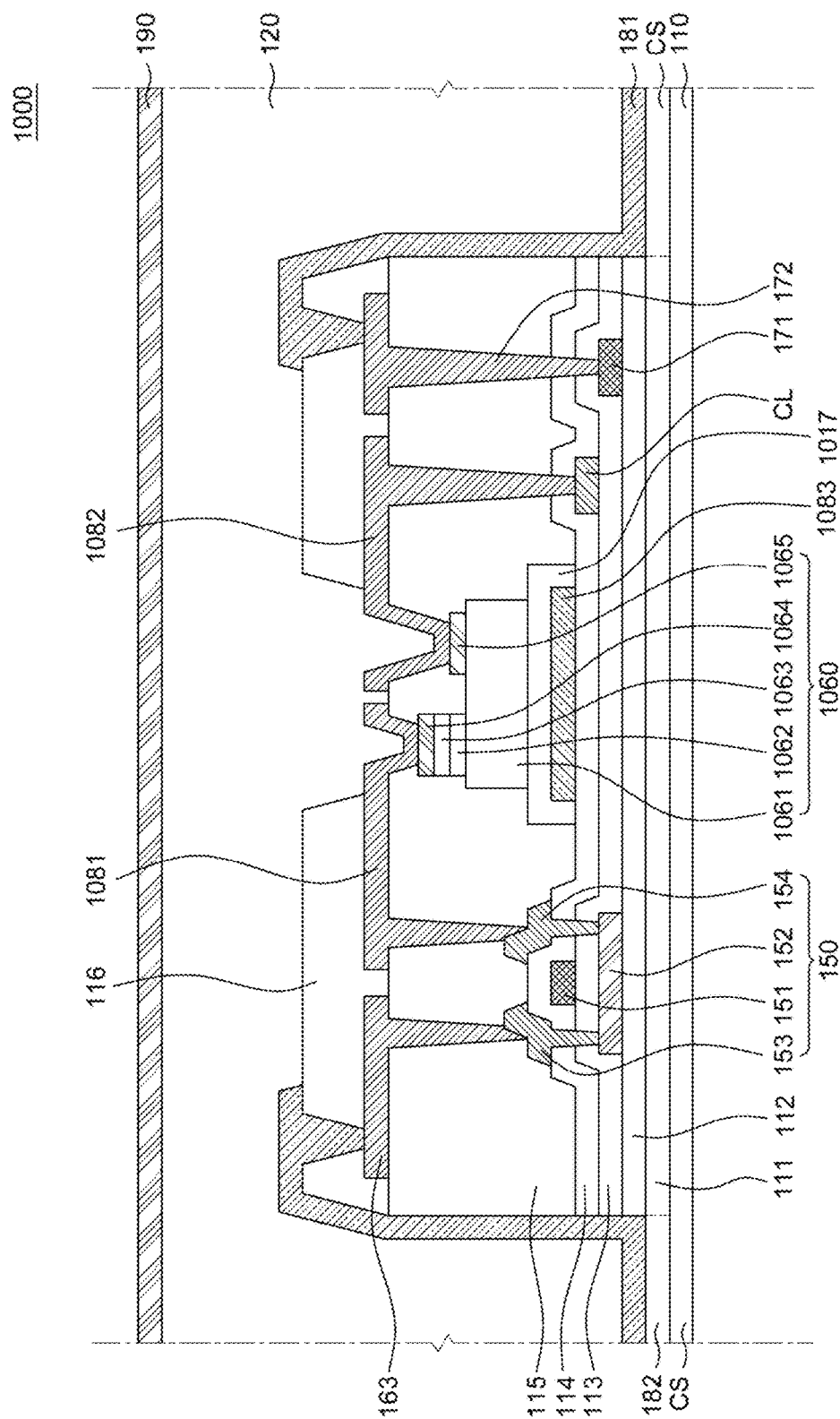
FIG. 10 is a schematic cross-sectional view of one subpixel of a stretchable display device according to still another embodiment of the present disclosure.

FIG. 10 is a schematic cross-sectional view of one subpixel of a stretchable display device 1000 according to still another embodiment of the present disclosure. A stretchable display device 1000 shown in FIG. 10 is substantially the same as the stretchable display device 100 shown in FIGS. 1 to 4 except for including a different LED 1060, so repetitive or redundant descriptions are not provided.

Referring to FIG. 10, a common line CL is disposed on the gate insulating layer 113. The common line CL is a line for applying a common voltage to a plurality of subpixels SPX. The common line CL may be made of the same material as the source electrode 153 and the drain electrode 154 of the transistor 150, but is not limited thereto.

A reflective layer 1083 is disposed on the inter-layer insulating layer 114. The reflective layer 1083 is a layer for discharging light, which emitted to the lower substrate 110 of light emitting from the LED 1060, to the outside by reflecting the light upward through a stretchable display device 1000. The reflective layer 1083 may be made of a metal material having high reflectance.

An adhesive layer 1017 is disposed on the reflective layer 1083 to cover the reflective layer 1083. The adhesive layer 1017, which is a layer for bonding the LED 1060 on the reflective layer 1083, may insulate the reflective layer 1083 made of a metal material and the LED 1060. The adhesive layer 1017 may be made of a thermosetting material or a photocuring material, but is not limited thereto. Although the adhesive layer 1017 is disposed to cover only the reflective layer 1083 in FIG. 10, the position of the adhesive layer 1017 is not limited thereto.

The LED 1060 is disposed on the adhesive layer 1017. The LED 1060 is disposed to overlap the reflective layer 1083. The LED 1060 includes an n-type layer 1061, an active layer 1062, a p-type layer 1063, an n-electrode 1065, and a p-electrode 1064. The LED 1060 is described as a lateral LED 1060 hereafter, but the structure of the LED 1060 is not limited thereto.

In detail, the n-type layer 1061 of the LED 1060 is disposed to overlap the reflective layer 1083 on the adhesive layer 1017. The n-type layer 1061 may be formed by injecting an n-type impurity into a gallium nitride having excellent crystallinity. The active layer 1062 is disposed on the n-type layer 1061. The active layer 1062, which is a light emitting layer that emits light in the LED 1060, may be made of a nitride semiconductor, for example, an indium gallium nitride. The p-type layer 1063 is disposed on the active layer 1062. The p-type layer 1063 may be formed by injecting a p-type impurity into a gallium nitride. However, the constituting materials of the n-type layer 1061, the active layer 1062, and the p-type layer 1063 are not limited thereto.

The p-electrode 1064 is disposed on the p-type layer 1063 of the LED 1060. The n-electrode 1065 is disposed on the n-type layer 1061 of the LED 1060. The n-electrode 1065 is spaced apart from the p-electrode 1064. In detail, the LED 1060 may be manufactured by sequentially stacking the n-type layer 1061, the active layer 1062, and the p-type layer 1063, etching a predetermined portion of the active layer 1062 and the p-type layer 1063, and then forming the n-electrode 1065 and the p-electrode 1064. The predetermined portion is a space for spacing the n-electrode 1065 and the p-electrode 1064 and the predetermined portion may be etched to expose a portion of the n-type layer 1061. In other words, the surface of the LED 1060 where the n-electrode 1065 and the p-electrode 1064 are disposed is not a planarized surface and may have different levels. Accordingly, the p-electrode 1064 is disposed on the p-type layer 1063, the n-electrode 1065 is disposed on the n-type layer 1061, and the p-electrode 1064 and the n-electrode 1065 are spaced from each other at different levels. Therefore, the n-electrode 1065 may be disposed adjacent to the reflective layer 1083 in comparison to the p-electrode 1064. The n-electrode 1065 and p-electrode 1064 may be made of a conductive material, for example, a transparent conductive oxide. Alternatively, the n-electrode 1065 and p-electrode 1064 may be made of the same material, but are not limited thereto.

A planarization layer 115 is disposed on the inter-layer insulating layer 114 and the adhesive layer 1017. The planarization layer 115 is a layer that planarizes the top of the transistor 150. The planarization layer 115 may be disposed in an area excepting the area where the LED 1060 is disposed while planarizing the top surface of the planarization layer 115. The planarization layer 115 may be composed of two or more layers.

A first electrode 1081 and a second electrode 1082 are disposed on the planarization layer 115. The first electrode 1081 is an electrode that electrically connects the transistor 150 and the LED 1060. The first electrode 1081 is connected with the p-electrode 1064 of the LED 1060 through a contact hole formed at the planarization layer 115. Further, the first electrode 1081 is connected with the drain electrode 154 of the transistor 150 through contact holes formed at the planarization layer 115 and the inter-layer insulating layer 114. However, the first electrode 1081 is not limited thereto and may be connected with the source electrode 153 of the transistor 150, depending on the type of the transistor 150. The p-electrode 1064 of the LED 1060 and the drain electrode 154 of the transistor 150 may be electrically connected by the first electrode 1081.

The second electrode 1082 is an electrode that electrically connects the LED 1060 and the common line CL. In detail, the second electrode 1082 is connected with the common line CL through the contact holes formed at the planarization layer 115 and the inter-layer insulating layer 114 and is connected with the n-electrode 1065 of the LED 1060 through the contact hole formed at the planarization layer 115. Accordingly, the common line CL and the n-electrode 1065 of the LED 1060 are electrically connected.

When the stretchable display device 1000 is turned on, voltages having different levels may be supplied respectively to the drain electrode 154 of the transistor 150 and the common line CL. The voltage that is applied to the drain electrode 154 of the transistor 150 may be applied to the first electrode 1081 and a common voltage may be applied to the second electrode 1082. Voltages having different levels may be applied to the p-electrode 1064 and the n-electrode 1065 through the first electrode 1081 and the second electrode 1082, so the LED 1060 may emit light.

Although the transistor 150 is electrically connected with the p-electrode 1064 and the common line CL is electrically connected with the n-electrode 1065 in the description referring to FIG. 10, they are not limited thereto. That is, the transistor 150 may be electrically connected with the n-electrode 1065 and the common line CL may be electrically connected with the p-electrode 1064.

A bank 116 is disposed on the planarization layer 115, the first electrode 1081, and a second electrode 1082. The bank 116 is disposed to overlap an end of the reflective layer 1083 and a portion not overlapped with the bank 116 of the reflective layer 1083 may be defined as a light emitting area. The bank 116 may be made of an organic insulating material and may be made of the same material as the planarization layer 115. The bank 116 may include a black material to suppress mixing of colors due to light emitted from the LED 1060 and transmitted to an adjacent subpixel SPX.

The stretchable display device 1000 according to still another embodiment of the present disclosure includes the LED 1060. Since the LED 1060 is made of not an organic material, but an inorganic material, reliability is high, so the lifespan is longer than that of a liquid crystal display element or an organic light emitting element. The LED 1060 is quickly turned on, consumes a small amount of power, has high stability because it has high shock-resistance, and may display high-luminance images because it has high emission efficiency. Accordingly, the LED 1060 is an element that is suitable to be applied even to very large screens. In particular, since the LED 1060 is made of not an organic material, but an inorganic material, an encapsulation layer that is required when an organic light emitting element is used may not be used. Accordingly, the encapsulation layer that may be easily damaged, such as cracking, when the stretchable display device 1000 is stretched may not be provided. Accordingly, it is possible not to use an encapsulation layer that may be damaged when the stretchable display device 1000 according to another embodiment of the present disclosure is deformed such as bending or stretching, by using the LED 1060 as a light emitting element in the stretchable display device 1000. Further, since the LED 1060 is made of not an organic material, but an inorganic material, the light emitting elements of the stretchable display device 1000 according to still another embodiment of the present disclosure may be protected from water or oxygen and their reliability may be high.

Figure 11:
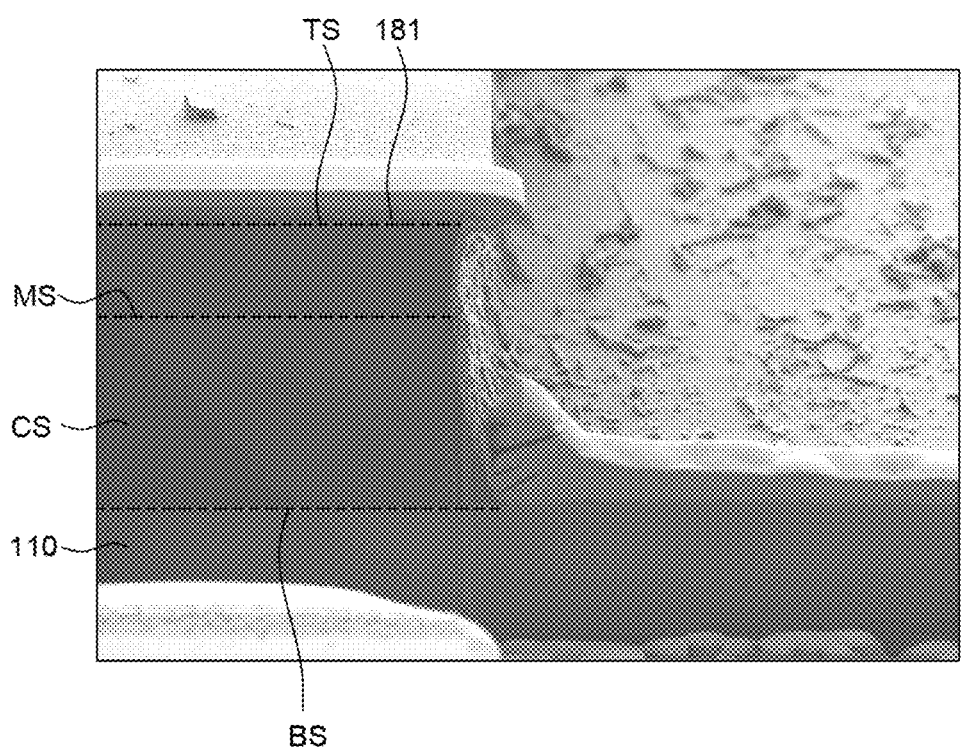
FIG. 11 is a Scanning Electron Microscope (SEM) image of a stretchable display device according to an embodiment of the present disclosure.
Figure 12A:
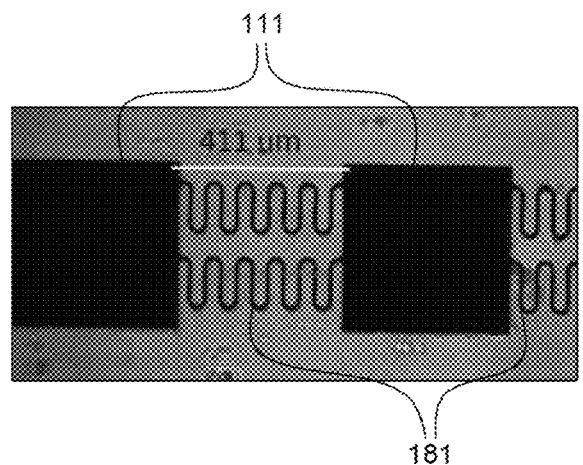
FIGS. 12A to 12C are images when a stretchable display device according to an embodiment of the present disclosure is stretched.
Figure 12B:
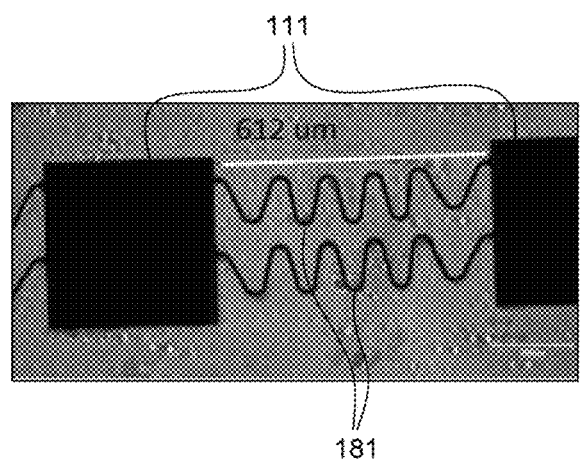
Figure 12C:
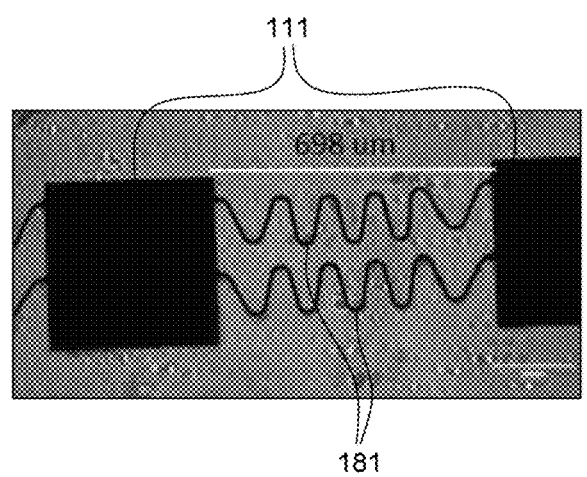

FIG. 11 is a scanning electron microscope (SEM) image of a stretchable display device according to an embodiment of the present disclosure. FIGS. 12A, 12B, 12C are images when a stretchable display device according to an embodiment of the present disclosure is stretched. In detail, FIG. 12A is an image before a stretchable display device is stretched, FIG. 12B is an image when the stretchable display device is stretched about 49%, and FIG. 12C is an image when the stretchable display device is stretched about 70%.

Referring to FIG. 11, a middle portion MS is defined between the top surface TS and the bottom surface BS of a plurality of connecting substrates CS and grooves recessed inward are formed on the plurality of connecting substrates CS in a stretchable display device 100 according to an embodiment of the present disclosure. Accordingly, when the stretchable display device 100 is stretched, the plurality of connecting lines CS may be horizontally stretched and vertically moved.

Referring to FIG. 12A, it is an initial state before the stretchable display device 100 shown in FIG. 11A is stretched. The distance between the plurality of connecting substrates CS was measured about 411 μm and the resistance of connecting lines 181 on the connecting substrates CS was measured about 57.5Ω.

Next, referring to FIG. 12B, when the stretchable display device 100 was stretched about 49%, that is, when the distance between the connecting substrates CS was about 612 μm, the resistance of the plurality of connecting lines 181 was measured about 58Ω. Accordingly, it may be found out that the resistance of the connecting lines 181 after the stretchable display device 100 is stretched is close to the resistance of the connecting lines 181 before stretching.

Further, referring to FIG. 12C, when the stretchable display device 100 was stretched about 70%, that is, when the distance between the plurality of connecting substrates CS was about 698 μm, the resistance of the connecting lines 181 was measured about 58Ω. Accordingly, it may be found out that the resistance of the connecting lines 181 after the stretchable display device 100 is stretched is close to the resistance of the connecting lines 181 before stretching.

Therefore, it may be found out that even though the stretchable display device 100 according to an embodiment of the present disclosure is stretched, the plurality of connecting substrates CS and the plurality of connecting lines 181 may be maintained in a state similar to the state before the stretchable display device 100 is stretched without being damaged.

Figure 13A:
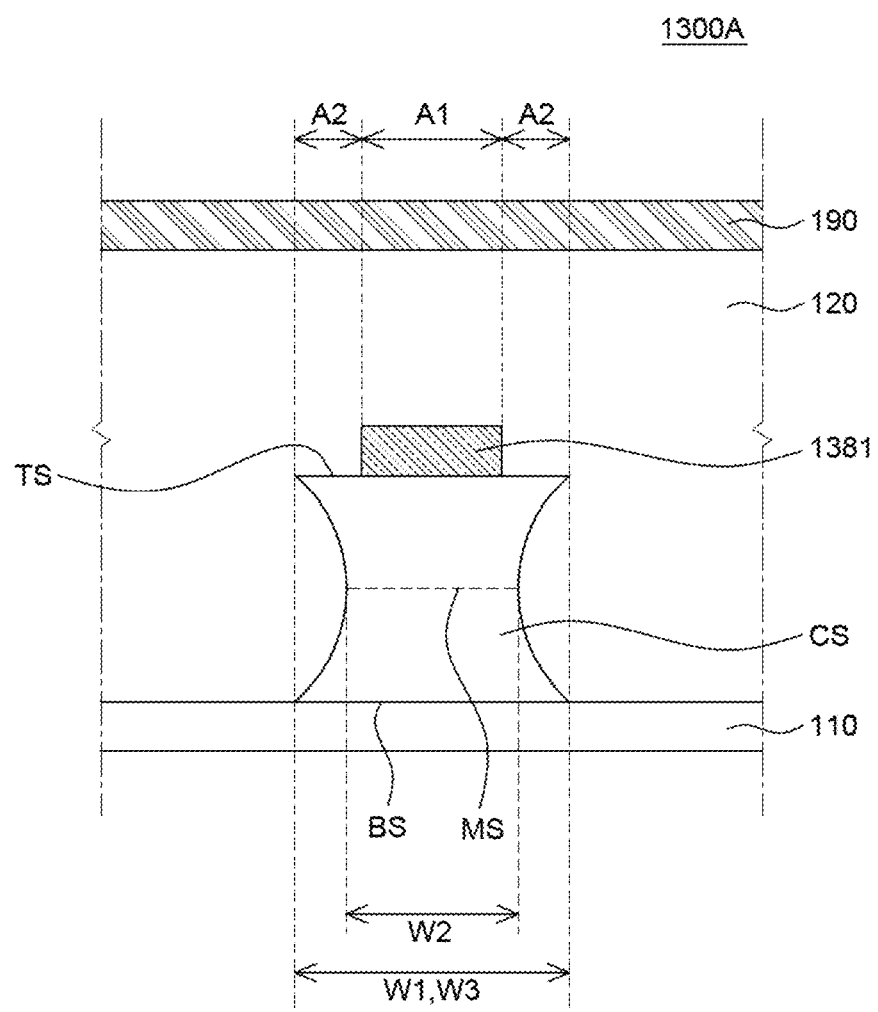
FIGS. 13A to 13C are schematic cross-sectional views illustrating connecting lines of a stretchable display device according to another embodiment of the present disclosure.
Figure 13B:
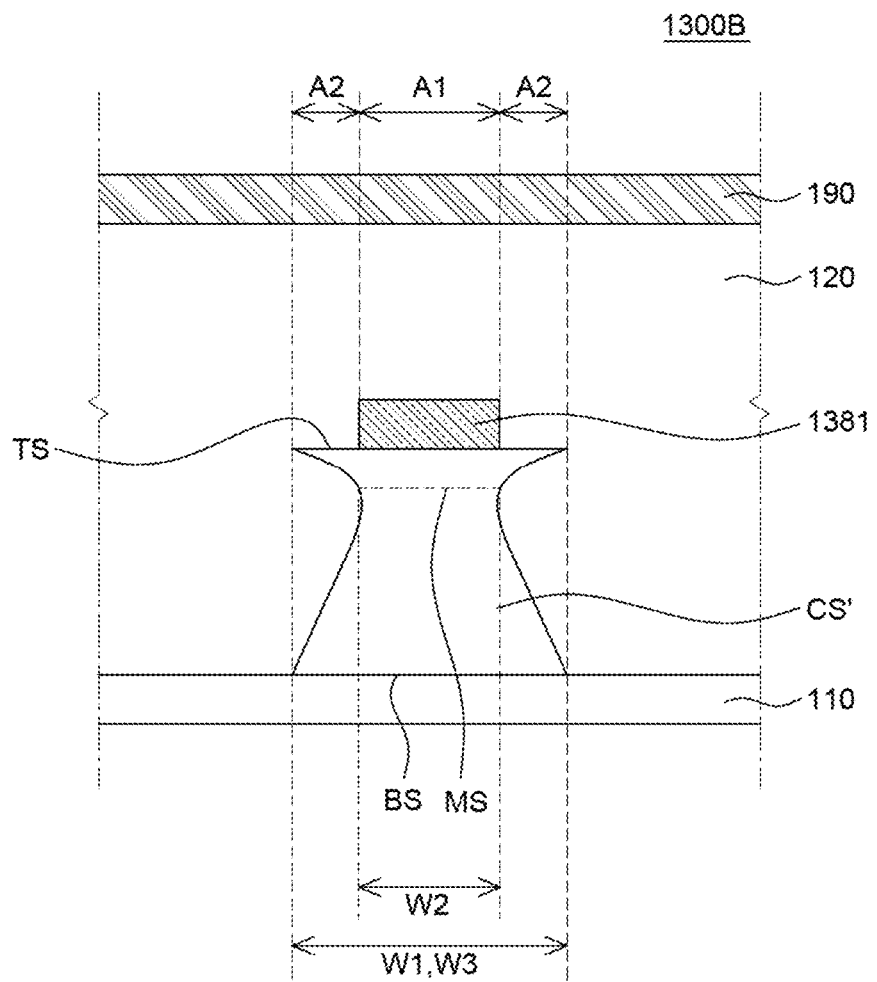
Figure 13C:
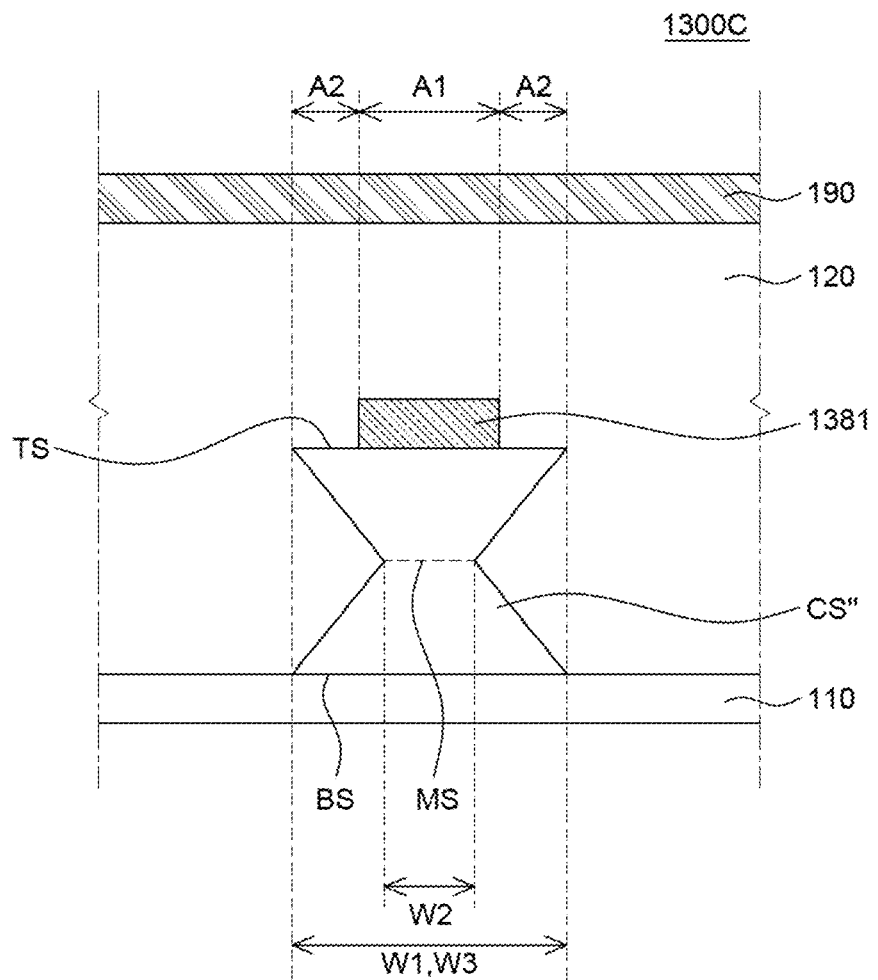
Figure 14:
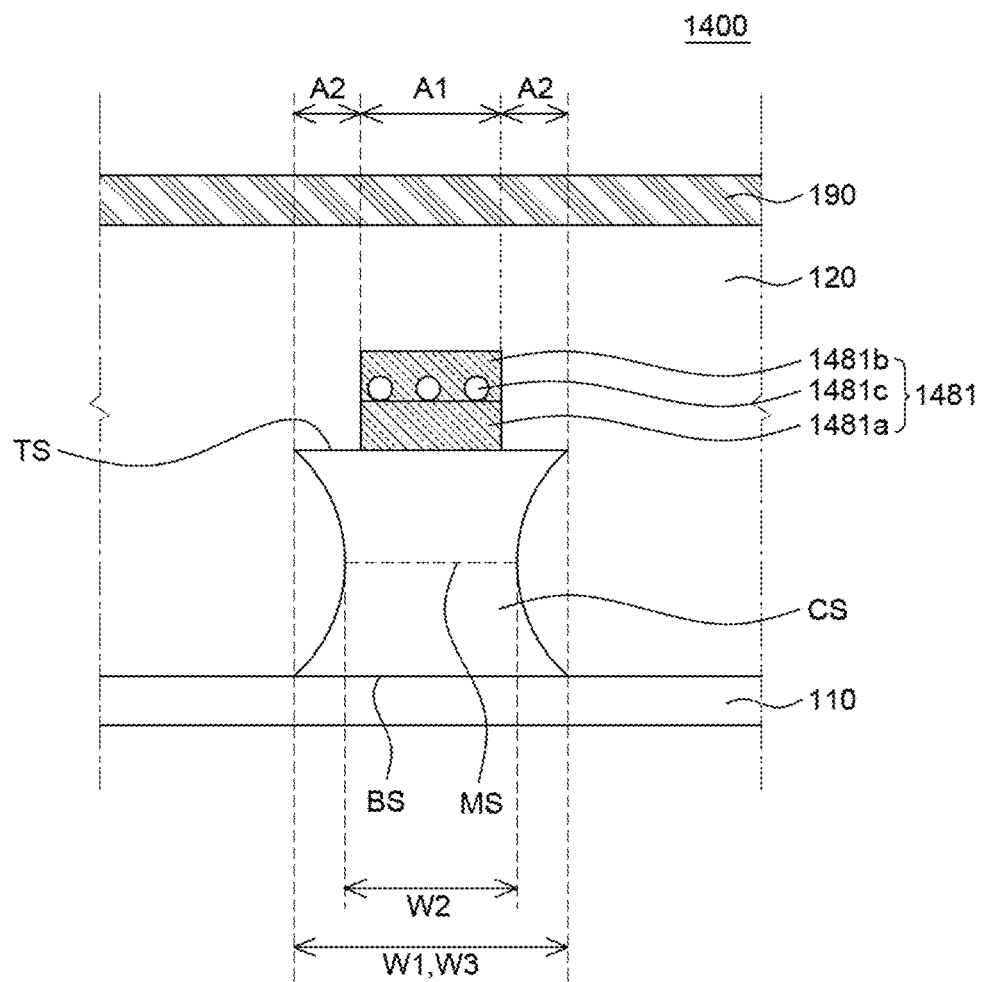
FIGS. 14 and 15 are schematic cross-sectional views illustrating connecting lines of a stretchable display device according to another embodiment of the present disclosure.
Figure 15:
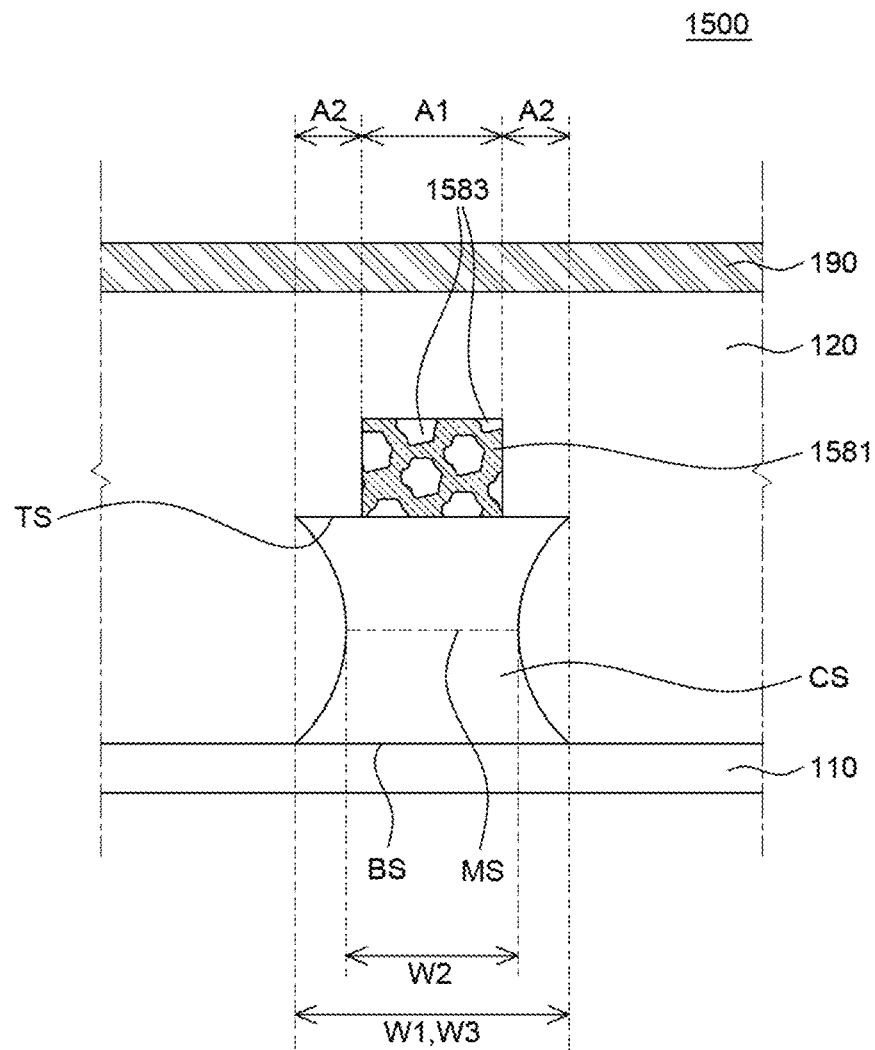

FIGS. 13A to 13C are schematic cross-sectional views illustrating connecting lines of a stretchable display device according to another embodiment of the present disclosure. FIGS. 14 and 15 are schematic cross-sectional views illustrating connecting lines of a stretchable display device according to another embodiment of the present disclosure. Stretchable display devices 1300A, 1300B, 1300C, 1400, and 1500 of FIGS. 13A to 13C and FIGS. 14 and 15 are substantially the same as the stretchable display devices 100, 500A, 500B, 700, and 800 of FIGS. 1 to 5B and FIGS. 7B and 8B, except for having a plurality of different connecting lines 1381, 1481, and 1581, so redundant descriptions are not provided.

Referring to FIGS. 13A to 13C and FIGS. 14 and 15, a plurality of connecting lines 1381, 1481, and 1581 each may be formed with a predetermined margin from the end of a connecting substrate CS. In detail, the top TS of the connecting substrate CS may be divided into a first area A1 that is an inner area and a second area A2 disposed outside the first area A1. Further, each of the plurality of connecting lines 1381, 1481, and 1581 is formed only in the first area A1 that is an inner area of the top TS of the connecting substrate CS and is not formed in the second area A2 that is an outer area of the top TS of the connecting substrate CS. Accordingly, the ends of the connecting lines 1381, 1481, and 1581 and the end of the connecting substrate CS can be spaced by a predetermined margin. For example, the distance between the ends of the connecting lines 1381, 1481, and 1581 and the end of the connecting substrate CS may be about 1 μm to 4 μm. In other words, the width of the second area A2 in which the plurality of connecting lines 1381, 1481, and 1581 are not formed may be about 1 μm to 4 μm. Here, the width of the second area A2 shown in FIG. 13A to FIG. 13C may be about 1 μm to 4 μm.

In relation to this, when the plurality of connecting lines 1381, 1481, and 1581 are each formed with a margin from the end of the connecting substrate CS, masks for preventing etching of the connecting lines 1381, 1481, and 1581 are disposed not only on the tops and sides of the connecting lines 1381, 1481, and 1581, but also up to the second area A2 that is the margin portion. Accordingly, with a mask formed also on the second area A2 that is the margin portion, when the connecting substrate CS is formed by etching a mother substrate (e.g., polyimide, PI) on which the connecting lines 1381, 1481, and 1581 are formed, the connecting lines 1381, 1481, and 1581 are not separated.

Accordingly, in the stretchable display devices 1300A, 1300B, 1300C, 1400, and 1500 according to another embodiment of the present disclosure, since each of the plurality of connecting lines 1381, 1481, and 1581 are formed with a margin from the end of the connecting substrate CS, it is possible to reduce damage to the plurality of connecting lines 1381, 1481, and 1581 when etching the connecting substrate CS of the stretchable display devices 1300A, 1300B, 1300C, 1400, and 1500.

Figure 16:
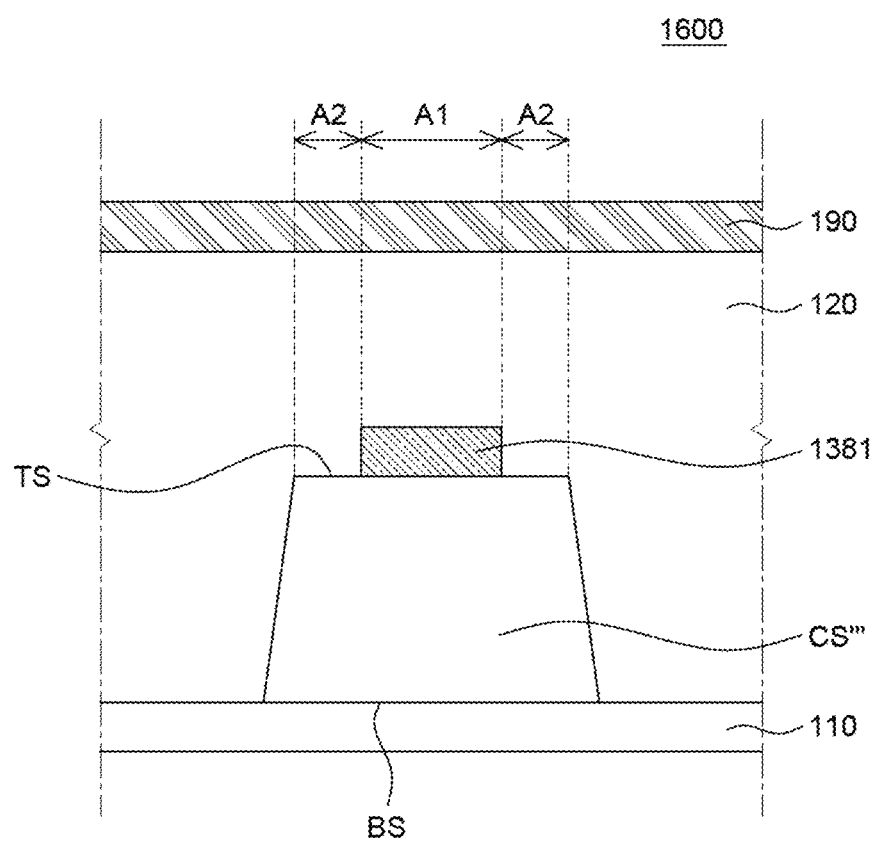
FIG. 16 is a cross-sectional view about a stretchable display device according to various embodiments of the present disclosure.

FIG. 16 is a cross-sectional view about a stretchable display device according to various embodiments of the present disclosure. The stretchable display device 1600 of FIG. 16 is substantially the same as the stretchable display device 1300 shown in FIGS. 13A to 13C except for having a plurality of different connecting substrates CS''', so repeated description is not provided.

Referring to FIG. 16, the cross-section of the plurality of connecting substrates CS''' may be a trapezoid shape or a tapered shape. In detail, the top TS of the connecting substrate CS''' overlaps the bottom BS of the connecting substrate CS''', and the area of the bottom BS of the connecting substrate CS''' may be larger than the area of the top TS of the connecting substrate CS'''. As described above, the cross-section of the plurality of connecting substrates CS''' may be a trapezoid shape or a tapered shape, but the cross-section of the plurality of connecting substrates CS''' may be variously changed in polygons, if necessary in processes and design.

The above embodiments are merely exemplary and do not mean to limit the scope for the present disclosure.

The following aspects are further found in the present disclosure:

In the first aspect, provided a stretchable display device, comprising: a lower substrate as a first substrate, the lower substrate having an active area and a non-active area surrounding the active area; a plurality of second substrates positioned on the lower substrate and horizontally separated from each other; a transistor disposed on the second substrate; a plurality of light emitting elements disposed above the transistor and above the plurality of second substrates; a plurality of third substrates positioned between the plurality of second substrates to interconnect two adjacent second substrates; an upper substrate covering the lower substrate and the plurality of light emitting elements; and wherein at least one of the lower substrate and the upper substrate is a flexible substrate, and is configured to be reversibly expand and contract.

In another alternative embodiment, the stretchable display device further comprising a plurality of connection lines disposed on the third substrate, and configured to connect to pads of the two adjacent second substrates.

In another alternative embodiment, wherein the third substrates as connecting substrates have curved shape in a plan view.

In another alternative embodiment, the third substrate have a top surface and a bottom surface, and a horizontal cross sectional area of the third substrate varies between the top surface and the bottom surface.

In another alternative embodiment, wherein the horizontal cross sectional area of the third substrate decrease away from the top surface.

In another alternative embodiment, wherein the third substrate further has a middle portion including a predetermined surface positioned between the top surface and the bottom surface of the third substrates, and the predetermined surface of the middle portion has the smallest width of surfaces positioned between the top surface and the bottom surface.

In another alternative embodiment, the third substrate has an hourglass-shaped cross-section.

In another alternative embodiment, wherein the middle portion of the third substrate is positioned closer to the top surface of the connecting substrate, or is positioned closer to the bottom surface of the connecting substrate.

In another alternative embodiment, the sides of the third substrate have an angular shape.

In another alternative embodiment, the plurality of connection lines include first connecting lines and second connecting lines, the first connecting lines extending in a first direction, and the second connecting lines extending in a second direction perpendicular to the first direction.

In another alternative embodiment, wherein the first connecting lines serve as gate lines, and the first connecting lines electrically connect the gate pads formed on each of the adjacent second substrates.

In another alternative embodiment, wherein the second connecting lines serve as data lines, and the second connecting lines electrically connect the source electrode of the transistors formed on each of the adjacent second substrates.

In another alternative embodiment, wherein at least some of the plurality of connection lines include a first connection layer, a second connection layer, and a plurality of flexible particles between the first connection layer and the second connection layer.

In another alternative embodiment, wherein at least some of the plurality of connection lines are made of a metal material, and have a net structure including a plurality of air gaps.

In another alternative embodiment, wherein the upper substrate fills the plurality of air gaps of the plurality of the connecting lines.

In another alternative embodiment, the upper substrate fills the gaps between the third substrates and the second substrate.

In another alternative embodiment, a top surface of the connecting substrates has a larger width than the connecting line.

In another alternative embodiment, wherein the plurality of light emitting elements include an organic light emitting element comprising an anode, an organic light emitting layer on the anode, and a cathode covering the organic light emitting layer; and wherein, the organic light emitting element further comprises encapsulation layer over the organic light emitting layer.

In another alternative embodiment, wherein the plurality of light emitting elements include an inorganic light emitting element, the inorganic light emitting element include a n-type layer, an active layer, a p-type layer, an n-electrode, and a p-electrode, without disposing any encapsulation layer over the inorganic light emitting element.

In another alternative embodiment, wherein a top of the third substrate include a first area and a second area disposed outside the first area, and the plurality of connecting lines are disposed only in the first area. In another alternative embodiment, wherein a width of the second area is about 1 μm to 4 μm.

In another aspect of present disclosure, there provided a display device, comprising a first substrate having an active area and a non-active area surrounding the active area; a plurality of second substrates positioned on the first substrate and separated from each other in horizontal direction; a plurality of light emitting elements disposed above the second substrates; a plurality of connecting substrates positioned between the plurality of second substrates to interconnect two adjacent second substrates; an upper substrate covering the first substrate and the plurality of light emitting elements; and wherein at least one of the first substrate and the upper substrate is configured to have a tensile fracture rate equal to or larger than about 100%.

In an alternative embodiment to this aspect, wherein the plurality of the second substrates are more rigid than the first substrate.

In an alternative embodiment to this aspect, the modulus of the second substrates is a thousand times or more of that of the first substrate.

In an alternative embodiment to this aspect, wherein the upper substrate is made of a material having a smaller modulus than the plurality of connecting substrates.

In an alternative embodiment to this aspect, the upper substrate is made of the same material as the first substrate.

In an alternative embodiment to this aspect, the stretchable display device further comprising a plurality of connection lines disposed on the connecting substrates, and configured to connect to pads of the two adjacent second substrates.

In an alternative embodiment to this aspect, wherein ends of the plurality of connecting substrates and ends of the plurality of connecting lines are spaced.

In an alternative embodiment to this aspect, wherein a distance between the ends of the plurality of connecting substrates and the ends of the plurality of connecting lines is about 1 µm to 4 µm. In an alternative embodiment to this aspect, wherein the upper substrate fills gaps between the connecting substrates and the second substrate.

In an alternative embodiment to this aspect, wherein the shape of the connection lines follows the shape of the connecting substrates in a plan view.

The foregoing description of the embodiments shown in the accompanying drawings herein was made. It may be appreciated that various changes or modifications to the embodiments may be made by the skilled person to the art. Accordingly, it is to be understood that such changes and modifications are included within the scope of the present disclosure, without departing from the spirit of the present disclosure.

The various embodiments described above can be combined to provide further embodiments. Further changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A stretchable display device, comprising:
   a lower substrate as a first substrate, the lower substrate having an active area and a non-active area adjacent to the active area;
   a plurality of second substrates positioned on the lower substrate and horizontally separated from each other;
   a transistor disposed on a second substrate of the plurality of second substrates;
   a light emitting element on the transistor and on the second substrate;
   one or more third substrates positioned between the plurality of second substrates to interconnect two adjacent second substrates, and the third substrate having a first portion having a narrower width than a second portion of the third substrate;
   an upper substrate covering the lower substrate and the light emitting element; and
   a plurality of connection lines disposed on the third substrate,
   wherein at least one of the lower substrate and the upper substrate is a flexible substrate, and is configured to be reversibly expand and contract,
   wherein the third substrate has a top surface and a bottom surface, the top surface is adjacent to the connection line and the bottom surface is adjacent to the lower substrate, and a vertical cross section of the third substrate between the top surface and the bottom surface has various shapes.

2. The stretchable display device according to claim 1, wherein the plurality of connection lines are configured to connect to pads of the two adjacent second substrates.

3. The stretchable display device according to claim 2, the plurality of connection lines include first connecting lines and second connecting lines, the first connecting lines extending in a first direction, and the second connecting lines extending in a second direction different from the first direction.

4. The stretchable display device according to claim 3, wherein the first connecting lines serve as gate lines, and the first connecting lines electrically connect the gate pads formed on each of the adjacent second substrates.

5. The stretchable display device according to claim 3, wherein the second connecting lines serve as data lines, and the second connecting lines electrically connect the source electrode of the transistors formed on each of the adjacent second substrates.

6. The stretchable display device according to claim 2, wherein at least some of the plurality of connection lines include a first connection layer, a second connection layer, and a plurality of flexible particles between the first connection layer and the second connection layer.

7. The stretchable display device according to claim 6, wherein an elastic modulus of the plurality of flexible particles is about 1 MPa or less.

8. The stretchable display device according to claim 2, wherein at least some of the plurality of connection lines are made of a metal material, and have a net structure.

9. The stretchable display device according to claim 8, wherein the plurality of connection lines include a plurality of gaps.

10. The stretchable display device according to claim 2, a top surface of the third substrate has a larger width than the connecting line.

11. The stretchable display device according to claim 8, wherein the upper substrate fills the plurality of gaps of the plurality of the connecting lines.

12. The stretchable display device according to claim 1, the third substrates having a curved shape.

13. The stretchable display device according to claim 2, wherein the vertical cross section of the third substrate gradually decreases from the top surface towards the bottom surface.

14. The stretchable display device according to claim 2, wherein the third substrate further has a middle portion including a selected position between the top surface and the bottom surface of the third substrate, and the selected position of the middle portion has the smallest width among the third substrate between the top surface and the bottom surface.

15. The stretchable display device according to claim 14, wherein the middle portion of the third substrate is positioned closer to the top surface of the third substrate than the bottom surface of the third substrate, or is positioned closer to the bottom surface of the third substrate than the top surface of the third substrate.

16. The stretchable display device according to claim 2, wherein the various shapes of the vertical cross-section of the third substrate includes an hourglass-shape cross-section.

17. The stretchable display device according to claim 2, wherein the various shapes of the vertical cross-section of the third substrate includes an angular shape.

18. The stretchable display device according to claim 1, wherein the upper substrate fills the gaps between the third substrates and the second substrate.

19. The stretchable display device according to claim 1, wherein the upper substrate is disposed in contact with portions of the one or more third substrates.

20. The stretchable display device according to claim 1, further comprising a plurality of conductive components disposed on each of the plurality of second substrates,
   wherein the one or more third substrates and the plurality of connecting lines have a curved shape, and
   the plurality of connecting lines is made of the same material as at least one of the plurality of conductive components.

21. The stretchable display device according to claim 1, wherein the plurality of light emitting elements include an organic light emitting element comprising an anode, an organic light emitting layer on the anode, and a cathode covering the organic light emitting layer; and wherein, the organic light emitting element further comprises encapsulation layer over the organic light emitting layer.

22. The stretchable display device according to claim 1, wherein the plurality of light emitting elements include an inorganic light emitting element, the inorganic light emitting element include a n-type layer, an active layer, a p-type layer, an n-electrode, and a p-electrode, without disposing any encapsulation layer over the inorganic light emitting element.

23. The stretchable display device according to claim 1, wherein a top of the third substrate include a first area and a second area disposed outside the first area, and the plurality of connecting lines are disposed only in the first area.

24. The stretchable display device according to claim 23, wherein a width of the second area is about 1 μm to 4 μm.

25. A display device, comprising:
a first substrate having an active area and a non-active area adjacent to the active area;
a plurality of second substrates on the first substrate and spaced apart from each other;
a plurality of light emitting elements disposed on the second substrates;
a plurality of connecting substrates positioned between the plurality of second substrates to interconnect two adjacent second substrates, each of the connecting substrate including a first portion having a narrower width than a second portion of the connecting substrate;
a third substrate on the first substrate and the plurality of light emitting elements; and
wherein at least one of the first substrate and the third substrate is configured to have a tensile fracture rate equal to or larger than about 100%.

26. The display device according to claim 25, wherein the plurality of the second substrates are more rigid than the first substrate.

27. The display device according to claim 26, a modulus of the second substrates is about one thousand times or more of that of the first substrate.

28. The display device according to claim 25, wherein the third substrate is made of a material having a smaller modulus than the plurality of connecting substrates.

29. The display device according to claim 28, the third substrate is made of substantially the same material as the first substrate.

30. The stretchable display device according to claim 25, further comprising a plurality of connection lines disposed on the connecting substrates, and configured to connect to pads of the two adjacent second substrates.

31. The stretchable display device according to claim 30, wherein ends of the plurality of connecting substrates and ends of the plurality of connecting lines are spaced apart from each other.

32. The stretchable display device according to claim 31, wherein a distance between the ends of the plurality of connecting substrates and the ends of the plurality of connecting lines is about 1 μm to 4 μm.

33. The stretchable display device according to claim 30, a shape of the connection lines follows a shape of the connecting substrates in a plan view.

34. The stretchable display device according to claim 25, wherein the upper substrate fills gaps between the connecting substrates and the second substrate.

* * * * *